United States Patent
Miyamoto et al.

(10) Patent No.: US 9,735,293 B2
(45) Date of Patent: Aug. 15, 2017

(54) SOLAR CELL ELEMENT

(71) Applicant: KYOCERA Corporation, Fushimi-ku, Kyoto-shi, Kyoto (JP)

(72) Inventors: Kouji Miyamoto, Nara (JP); Shigeo Aono, Kyoto (JP); Tomofumi Honjo, Higashiomi (JP); Shiro Miyazaki, Kyoto (JP); Masahiro Tanaka, Kirishima (JP); Koichiro Niira, Higashiomi (JP); Kenichi Kurobe, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 14/389,691

(22) PCT Filed: Mar. 28, 2013

(86) PCT No.: PCT/JP2013/059174
§ 371 (c)(1),
(2) Date: Sep. 30, 2014

(87) PCT Pub. No.: WO2013/146973
PCT Pub. Date: Oct. 3, 2013

(65) Prior Publication Data
US 2015/0075605 A1 Mar. 19, 2015

(30) Foreign Application Priority Data
Mar. 30, 2012 (JP) ................................ 2012-078930

(51) Int. Cl.
*H01L 31/0216* (2014.01)
*H01L 31/068* (2012.01)
(Continued)

(52) U.S. Cl.
CPC .. *H01L 31/02167* (2013.01); *H01L 31/02168* (2013.01); *H01L 31/022425* (2013.01);
(Continued)

(58) Field of Classification Search
CPC ..... H01L 31/00; H01L 31/02; H01L 31/0216; H01L 31/02167; H01L 31/02168; H01L 31/04; H01L 31/18; H01L 31/068
See application file for complete search history.

(56) References Cited

U.S. PATENT DOCUMENTS

| 2009/0165855 A1 | 7/2009 | Sun et al. |
| 2012/0174960 A1 | 7/2012 | Hashigami et al. |
| 2013/0061926 A1 | 3/2013 | Komoda et al. |

FOREIGN PATENT DOCUMENTS

| CA | 2774405 A1 | 3/2011 |
| JP | 2009-164544 A | 7/2009 |

(Continued)

OTHER PUBLICATIONS

International Preliminary Report on Patentability and Written Opinion of the International Searching Authority issued for counterpart International Application No. PCT/JP2013/059174.

(Continued)

*Primary Examiner* — Christina Chern
(74) *Attorney, Agent, or Firm* — Procopio Cory Hargreaves and Savitch LLP

(57) ABSTRACT

This solar cell element, which is increased in the conversion efficiency due to improved effect of passivation, includes a semiconductor substrate in which a p-type first semiconductor region and an n-type second semiconductor region are stacked such that the first semiconductor region is located nearmost a first principal surface side and the second semiconductor region is located nearmost a second principal surface side; and a first passivation film containing aluminum oxide and arranged on the first principal surface side of the first semiconductor region. In the inside of the first passivation film of the solar cell element, the first ratio obtained by dividing the aluminum atomic density by the oxygen atomic density is 0.613 or more and less than 0.667 and the second ratio obtained by dividing the sum of the aluminum atomic density and the hydrogen atomic density by the oxygen atomic density is 0.667 or more and less than 0.786.

5 Claims, 11 Drawing Sheets

(51) Int. Cl.
  *H01L 31/0224* (2006.01)
  *H01L 31/048* (2014.01)
(52) U.S. Cl.
  CPC .......... *H01L 31/048* (2013.01); *H01L 31/068* (2013.01); *Y02E 10/547* (2013.01)

(56) References Cited

FOREIGN PATENT DOCUMENTS

| JP | 2010-171263 A | 8/2010 |
| WO | 2011/033826 A1 | 3/2011 |
| WO | 2011/145731 A1 | 11/2011 |

OTHER PUBLICATIONS

International Search report dated May 14, 2013 issue in correponding Internation application No. PCT/JP32013/059174.
B.Hoex, "Ultralow surface recombination of c-Si substrates passivated by plasma-assisted atomic layer deposited Al2O3", Applied Physics Letters, 2006, vol. 89, No. 4.
G.Dingemans, "Comparison between aluminum oxide surface passivation films deposited with thermal ALD, plasma ALD and PECVD", 35th IEEE Photovoltaic Specialists Conference, 2010, p. 3118-3121.
Extended European Search Report dated Oct. 8, 2015, issued by the European Patent Office for Counterpart European Application No. EP 13769811.4.

F I G. 4
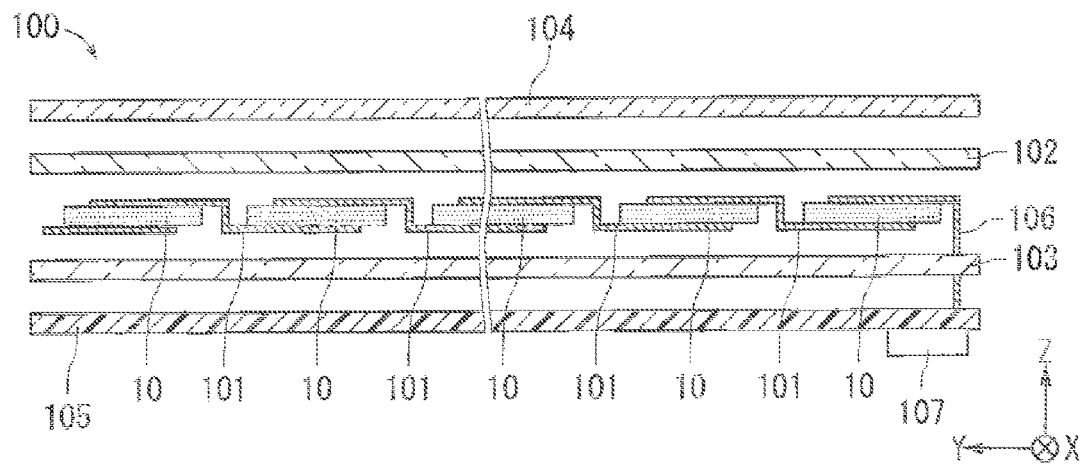
F I G. 5
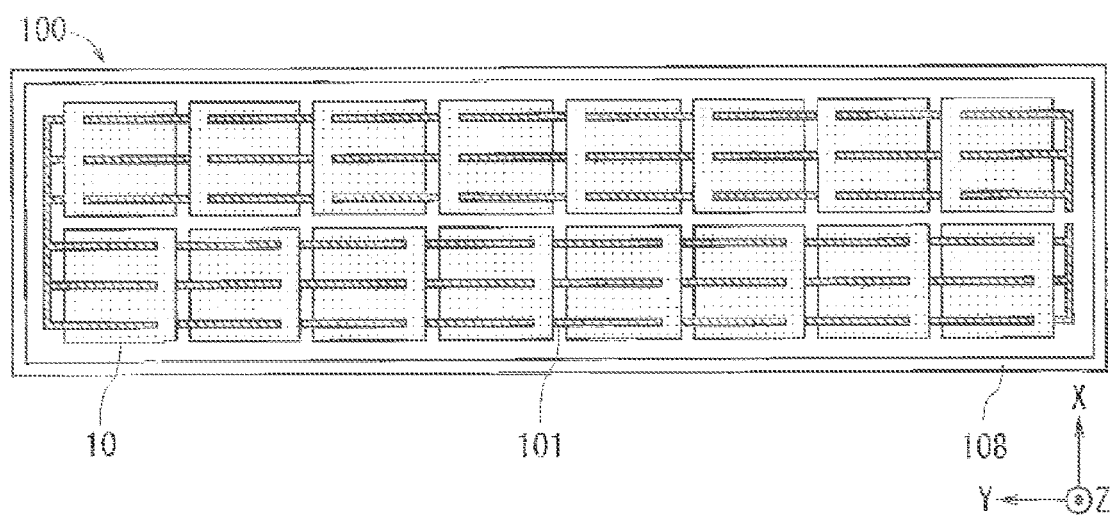

SOLAR CELL ELEMENT

TECHNICAL FIELD

The present invention relates to a solar cell element.

BACKGROUND ART

In a solar cell element having a silicon substrate, a passivation film is provided on a surface of the silicon substrate for reducing recombination of minority carriers, and a technology using, for example, silicon oxide, aluminum oxide, zinc oxide, or indium tin oxide as the material of the passivation film has been proposed (e.g., see Japanese Patent Laid-Open No. 2009-164544).

SUMMARY OF INVENTION

Problems to be Solved by the Invention

However, the solar cell elements are demanded to have further improved conversion efficiencies. For example, it has been intended to enhance the conversion efficiency by prolonging the time (effective lifetime) necessary for recombining minority carriers at an interface through a further improvement in passivation effect.

It is known that an effective lifetime $\tau$ in a structure of a bulk substrate having passivation films on both surfaces generally has a relationship: $(1/\tau)=(1/\tau b)+(2S/W)$, wherein $\tau b$ represents the lifetime of the bulk substrate, S represents the surface recombination velocity of minority carriers on the surface of the bulk substrate, and W represents the thickness of the bulk substrate.

In an actual solar cell element, for example, the effective lifetime $\tau$ of a p-type bulk substrate in a p-n junction structure is a function of a lifetime $\tau b$ and a surface recombination velocity S, is in proportional to the lifetime $\tau b$, and is in inversely proportional to the surface recombination velocity S. That is, it is important to reduce the surface recombination velocity S for prolonging the effective lifetime $\tau$.

Accordingly, in order to reduce the surface recombination velocity S, a passivation technology using aluminum oxide films has been being paid attention as a technology of enhancing the effect of passivation, and a solar cell element having a coversion efficiency further enhanced by the use of an aluminum oxide film has been demanded.

Means for Solving the Problems

In order to solve the above-mentioned problems, the solar cell element according to the present invention includes a semiconductor substrate in which a p-type first semiconductor region and an n-type second semiconductor region are stacked such that the first semiconductor region is located nearmost a first principal surface side and the second semiconductor region is located nearmost a second principal surface side; and a first passivation film containing aluminum oxide and arranged on the first principal surface side of the first semiconductor region. In the inside of the first passivation film of the solar cell element, the first ratio obtained by dividing the aluminum atomic density by the oxygen atomic density is 0.613 or more and less than 0.667 and the second ratio obtained by dividing the sum of the aluminum atomic density and the hydrogen atomic density by the oxygen atomic density is 0.667 or more and less than 0.786.

Advantageous Effects of Invention

In the solar cell element having the structure described above, the effective lifetime necessary for recombination of minority carriers is prolonged. That is, the conversion efficiency is further enhanced through an improvement in the effect of passivation.

BRIEF DESCRIPTION OF DRAWINGS

FIG. 4 is an exploded view schematically illustrating a cross section of a solar cell module according to an embodiment of the present invention.

FIG. 5 is a plan view shcematically illustrating the external appearance of a solr cell module according to an embodiment of the present invention.

MODE FOR CARRYING OUT OF THE INVENTION

Figure 1:
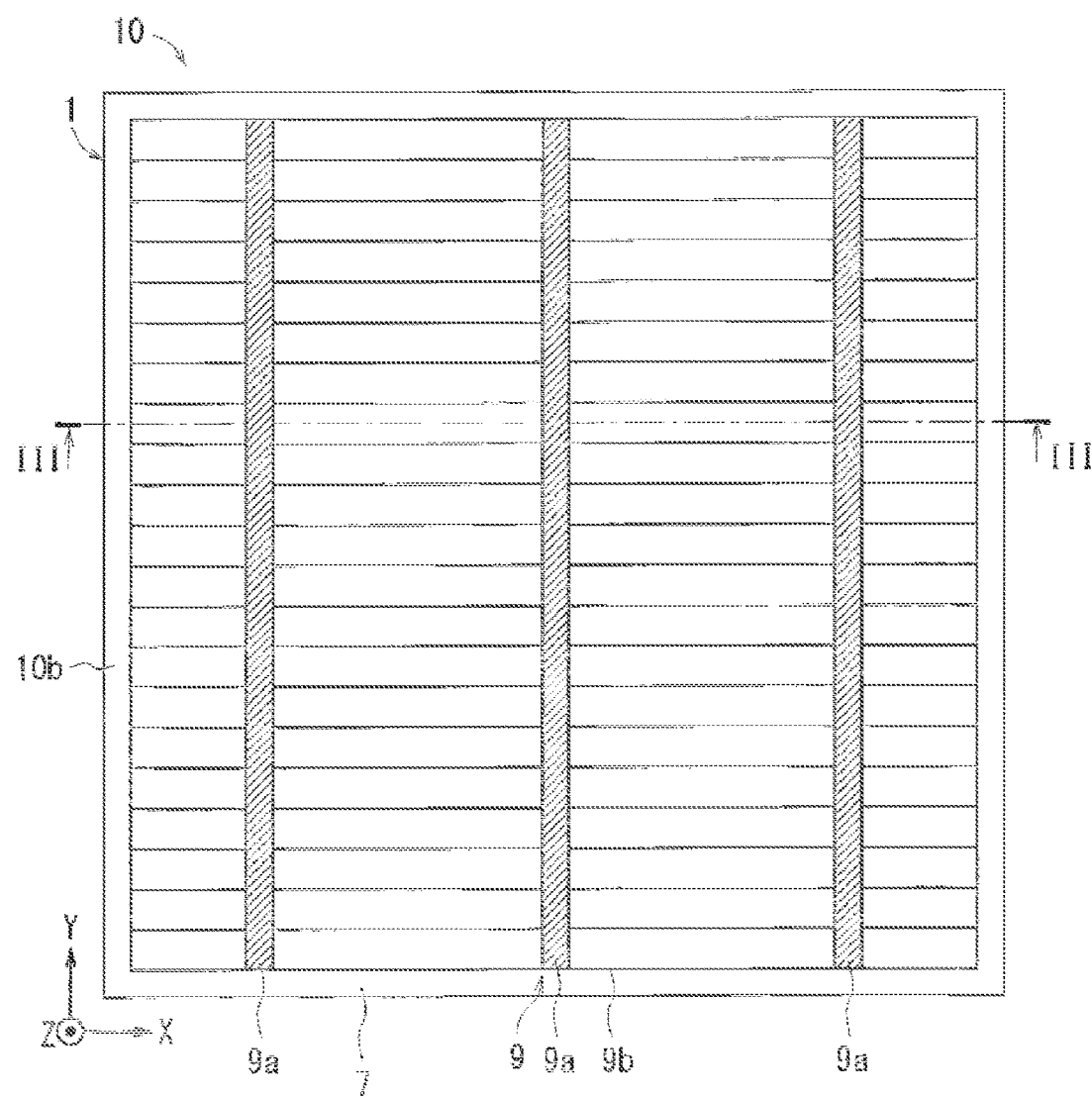
FIG. 1 is a plan view schematically illustrating the external appearance of the light-receiving surface of a solar cell element according to an embodiment of the present invention.

An embodiment and various modifications of the present invention will now be described with reference to the drawings. In the drawings, the portions having the same structures and functions are denoted by the same symbols, and duplicate explanations are omitted in the following description. The drawings are schematic, and the sizes, positional relations, and other factors of each structure shown in each drawing can be appropriately changed. In FIGS. 1 to 5, a right-hand XYZ coordinate system where a direction (direction toward the right of the drawing in FIG. 1) orthogonal to the extending direction of the first output extraction electrode 8a is defined as the +X direction.

(1) An Embodiment (1-1) Schematic Structure of Solar Cell Element

Figure 2:
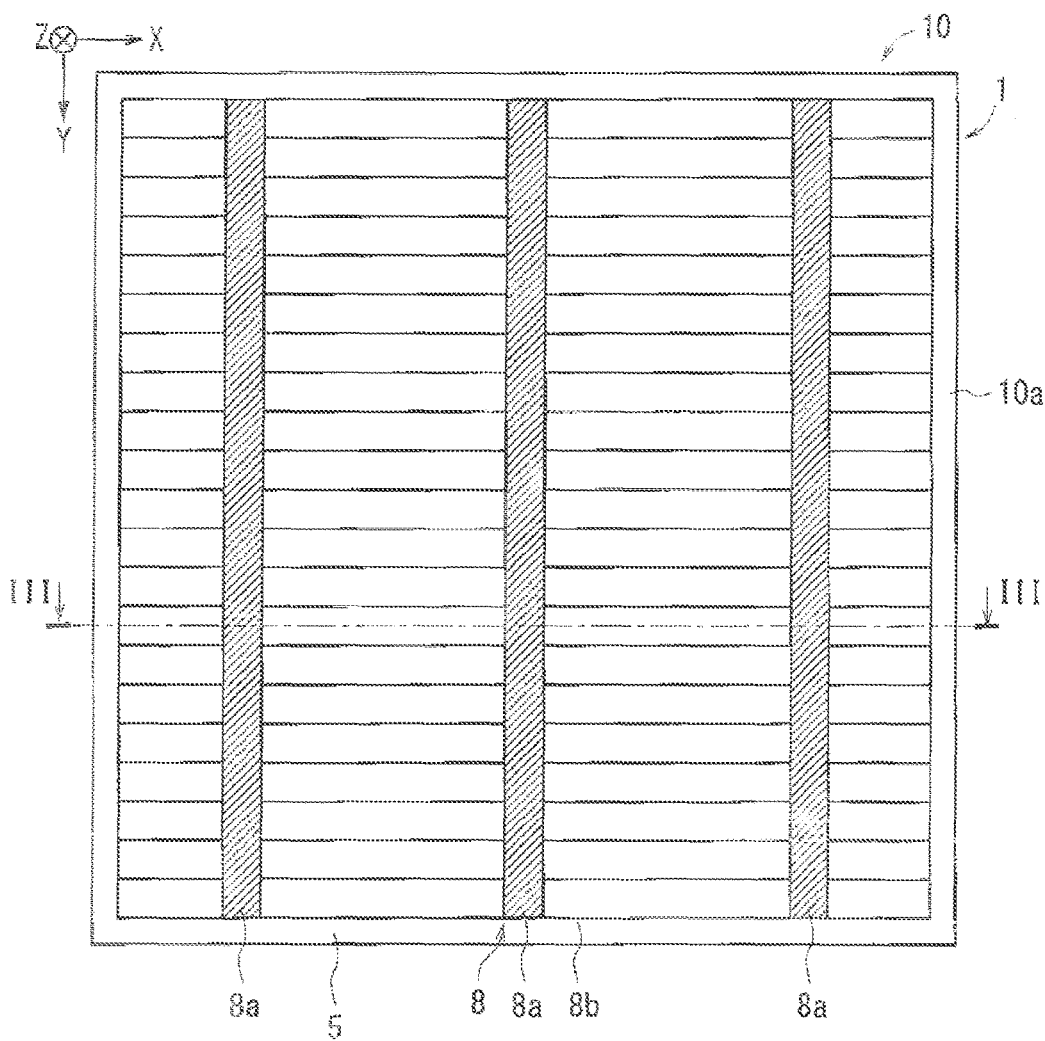
FIG. 2 is a plan view schematically illustrating the external appearance of the non-light-receiving surface of a solar cell element according to an embodiment of the present invention.
Figure 3:
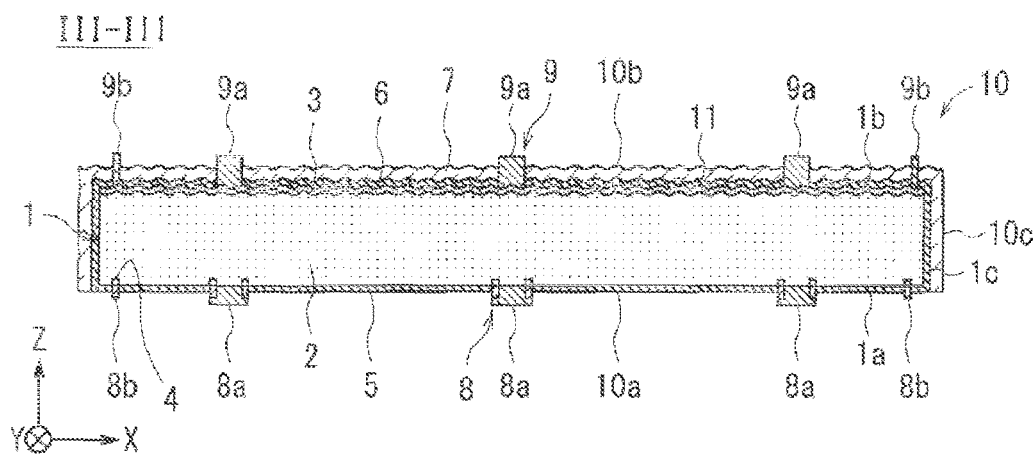
FIG. 3 is an XZ sectional view along the alternate long and short dash line III-III in FIGS. 1 and 2.

As shown in FIGS. 1 to 3, the solar cell element 10 includes a first principal surface 10a, a second principal surface 10b, and side surface 10c. The second principal surface 10b is a surface (light-receiving surface) receiving incident light. The first principal surface 10a is a surface (non-light-receiving surface) located on the opposite side of the second principal surface 10b in the solar cell element 10. The side surface 10c connects between the first principal surface 10a and the second principal surface 10b. In FIG. 3, the second principal surface 10b is drawn as the upper surface on the +Z side of the solar cell element 10, and the first principal surface 10a is drawn as the lower surface on the −Z side of the solar cell element 10.

The solar cell element 10 also includes a semiconductor substrate 1, a first passivation layer 5 serving as a first passivation film, a second passivation layer 6 serving as a second passivation film, an antireflection layer 7, a first electrode 8, and a second electrode 9.

The passivation effect of the first passivation layer 5 and the second passivation layer 6 is the passivation effect (field-effect passivation) by the built-in electric field (formation of an electric field near the interface by the presence of a passivation layer) and the passivation effect (chemical passivation) by the termination of dangling bonds of the interface. Here, the field-effect passivation means that the effect increases with an increase in the fixed charge density of the passivation layer. For example, in p-type silicon, a passivation layer having a larger negative fixed charge density is more preferred. The chemical passivation means that the effect increases with a decrease in the interface state density.

The semiconductor substrate 1 has a structure in which a first semiconductor region 2 and a second semiconductor region 3 are stacked. The first semiconductor region 2 is located nearmost the first principal surface 1a (the face on the −Z side in the drawing) side of the semiconductor substrate 1. The second semiconductor region 3 is located nearmost the second principal surface 1b (the face on the +Z side in the drawing) side of the semiconductor substrate 1. The first semiconductor region 2 is a region of the semiconductor showing p-type conduction, whereas the second semiconductor region 3 is a region of the semiconductor showing n-type conduction. The first semiconductor region 2 and the second semiconductor region 3 form a p-n junction region.

The semiconductor of the first semiconductor region 2 can be crystalline silicon such as single crystalline silicon or polycrystalline silicon. The first semiconductor region 2 shows p-type conduction by using, for example, at least one of boron and gallium as the p-type dopant. The thickness of the first semiconductor region 2 can be, for example, 250 μm or less and may be 150 μm or less. The first semiconductor region 2 may have any shape. For example, a first semiconductor region 2 having a square shape in a planar view can be readily produced.

The second semiconductor region 3 is formed in the surface layer of a p-type crystalline silicon substrate (a crystalline silicon substrate) on the second principal surface 1b side by dispersion of an element as an n-type dopant to the region of the second principal surface 1b side of the crystalline silicon substrate. As a result, the region other than the second semiconductor region 3 of the crystalline silicon substrate can be the first semiconductor region 2. The n-type dopant may be, for example, phosphorus.

Furthermore, as shown in FIG. 3, an irregularity portion 11 is provided on the second principal surface 1b of the semiconductor substrate 1. A convex portion of the irregularity portion 11 may have a height of, for example, 0.1 μm or more and 10 μm or less and may have a width of, for example, about 1 μm or more and 20 μm or less. A concave portion of the irregularity portion 11 may have, for example, an approximately spherical face shape. Herein, the height of a convex portion refers to the distance from a plane (reference plane) that passes the bottom of the concave portion and is parallel to the first principal surface 10a to the top face of the convex portion in the normal direction of the reference plane. The width of a convex portion refers to the distance between the bottoms of adjacent concave portions in the direction parallel to the reference plane.

The first passivation layer 5 as the first passivation film is arranged on the first principal surface 1a side of the semiconductor substrate 1. That is, the first passivation layer 5 is disposed on the first semiconductor region 2 on the first principal surface 1a side. The material of the first passivation layer 5 may be, for example, aluminum oxide. The presence of the first passivation layer 5 reduces the recombination of minority carriers at the first principal surface 1a in the semiconductor substrate 1 by the so-called passivation effect. Consequently, the open circuit voltage and the short circuit current of the solar cell element 10 are increased to improve the output characteristics of the solar cell element 10. The first passivation layer 5 can have an average thickness of, for example, about 3 nm or more and 100 nm or less.

In this first passivation layer 5, when the aluminum oxide has a negative fixed charge density, the energy band is curved in the direction of reducing the minority carriers, electrons, in the first semiconductor region 2 in the vicinity of the interface with the first passivation layer 5. Specifically, in the first semiconductor region, the energy band curves such that the electronic potential increases towards the interface with the first passivation layer 5. Consequently, the passivation effect by a built-in electric field is enhanced. Furthermore, in this first passivation layer 5, the passivation effect by a built-in electric field and the passivation effect by the termination of dangling bonds are increased by appropriately controlling, for example, the composition.

The second passivation layer 6 as the second passivation film is arranged on the second principal surface 1b side of the semiconductor substrate 1. That is, the second passivation layer 6 is disposed on the second semiconductor region 3 on the second principal surface 1b side. The presence of the second passivation layer 6 reduces the recombination of minority carriers in the semiconductor substrate 1 on the second principal surface 1b side by the passivation effect by the termination of dangling bonds. Consequently, the open circuit voltage and the short circuit current of the solar cell element 10 are increased to improve the output characteristics of the solar cell element 10. The second passivation layer 6 can have an average thickness of, for example, about 3 nm or more and 100 nm or less.

Here, when the material of the second passivation layer 6 is aluminum oxide, for example, an antireflection layer 7 having a positive interface fixed charge density or a negative interface fixed charge density less than that of the aluminum oxide can be disposed on the second passivation layer 6. In such a structure, a defect that the energy band is curved in the direction of increasing the minority carriers, holes, is prevented by that in the second semiconductor region 3, the second passivation layer 6 has a negative interface fixed charge density in the vicinity of the interface with the second passivation layer 6. As a result, characteristic degradation due to an increase in recombination of the minority carriers in the semiconductor substrate 1 on the second principal surface 1b side can be inhibited.

The first passivation layer 5 and the second passivation layer 6 are formed by an atomic layer deposition (ALD) method using an organic metal gas containing aluminum, such as trimethylaluminum (TMA) or triethylaluminum (TEA), as an aluminum supplier and a gas containing oxygen, such as ozone or water, for oxidizing aluminum, as a raw material.

The antireflection layer 7 is a film for enhancing the efficiency of absorbing light by the solar cell element 10. The antireflection layer 7 is disposed on the second passivation layer 6 on the second principal surface 10b side. The material of the antireflection layer 7 can be, for example, silicon nitride or silicon oxide. The thickness of the antireflection layer 7 can be appropriately determined depending on the materials of the semiconductor substrate 1 and the antireflection layer 7. Consequently, the solar cell element 10 achieves a condition in which light in a specific wavelength region is hardly reflected. Here, the specific wavelength region refers to a wavelength region around the peak wavelength of the irradiation intensity of sunlight. When the semiconductor substrate 1 is a crystalline silicon substrate, the antireflection layer 7 can have a refractive index of, for example, about 1.8 or more and 2.3 or less and can have an average thickness of, for example, about 20 nm or more and 120 nm or less.

The antireflection layer 7 may be disposed on the semiconductor substrate 1 on the side surface 10c side. In such a case, the antireflection layer 7 formed by the ALD method is compact, and, thereby, the formation of fine apertures such as pinholes is notably reduced also in the side surface 10c of the semiconductor substrate 1 to prevent characteristic degradation due to the occurrence of leakage current.

The third semiconductor region 4 is disposed on the semiconductor substrate 1 on the first principal surface 1a side. The third semiconductor region 4 shows the same p-type conduction as that of the first semiconductor region 2. The concentration of a dopant in the third semiconductor region 4 is higher than the concentration of the dopant in the first semiconductor region 2. That is, the third semiconductor region 4 is formed by doping the semiconductor substrate 1 with a p-type dopant at a concentration higher than the concentration of the p-type dopant doped to the semiconductor substrate 1 for forming the first semiconductor region 2.

The third semiconductor region 4 has a role of reducing recombination of minority carriers in the region on the first principal surface 1a side of the semiconductor substrate 1 by generating a built-in electric field on the first principal surface 1a side of the semiconductor substrate 1. Consequently, the presence of the third semiconductor region 4 can further enhance the conversion efficiency of the solar cell element 10. The third semiconductor region 4 is formed by, for example, doping the first principal surface 1a side of the semiconductor substrate 1 with an element to be a dopant such as boron or aluminum.

The first electrode 8 is arranged on the first principal surface 10a side of the semiconductor substrate 1. As shown in FIG. 2, the first electrode 8 includes, for example, a plurality of first output extraction electrodes 8a extending in the Y direction and a large number of first linear collecting electrodes 8b extending in the X direction. The first output extraction electrodes 8a each at least partially intersect with a plurality of the first linear collecting electrodes 8b and are electrically connected to the plurality of the first collecting electrodes 8b.

The first collecting electrode 8b can have a width of, for example, about 50 μm or more and 300 μm or less in the short direction. The first output extraction electrode 8a can have a width of, for example, about 1.3 mm or more and 3 mm or less in the short direction. That is, the first collecting electrode 8b may have any width in the short direction within a range that is less than the width in the short direction of the first output extraction electrode 8a. The distance between adjacent first collecting electrodes 8b of the plurality of the first collecting electrodes 8b can be about 1.5 mm or more and 3 mm or less. The first electrode 8 can have a thickness of, for example, about 10 μm or more and 40 μm or less. The first electrode 8 can be formed by, for example, applying a conductive paste (silver paste) containing silver onto the first principal surface 1a of the semiconductor substrate 1 in a desired pattern by, for example, screen printing and then firing it. The material of the first collecting electrode 8b may be mainly aluminum, and the material of the first output extraction electrode 8a may be mainly silver.

The second electrode 9 is arranged on the second principal surface 10b side of the semiconductor substrate 1. As shown in FIG. 1, the second electrode 9 includes, for example, a plurality of second output extraction electrodes 9a extending in the Y direction and a large number of second linear collecting electrodes 9b extending in the X direction. The second output extraction electrodes 9a each at least partially intersect with a plurality of the second linear collecting electrodes 9b and are electrically connected to the second collecting electrodes 9b.

The second collecting electrode 9b can have a width of, for example, about 50 μm or more and 200 μm or less in the short direction. The second output extraction electrode 9a can have a width of, for example, about 1.3 mm or more and 2.5 mm or less in the short direction. That is, the second collecting electrode 9b may have any width in the short direction within a range that is less than the width in the short direction of the second output extraction electrode 9a. The distance between adjacent second collecting electrodes 9b can be about 1.5 mm or more and 3 mm or less. The second electrode 9 can have a thickness of, for example, about 10 μm or more and 40 μm or less. The second electrode 9 can be formed by, for example, applying a silver paste onto the second principal surface 10b of the semiconductor substrate 1 in a desired pattern by, for example, screen printing and then firing it.

(1-2) Passivation Effect

Aluminum oxide usually has a stoichiometric composition $Al_2O_3$ in which the ratio (first ratio) $R_{Al/O}$ of the aluminum atomic density (Al) to the oxygen atomic density (O) is 2/3. Here, the atomic density refers to the number of atoms per unit volume and is expressed by the number of atoms per 1 cm$^3$ (unit: atoms/cm$^3$). When the first ratio $R_{Al/O}$ is less than 2/3, specifically, when the first ratio obtained by dividing the aluminum atomic density by the oxygen atomic density is less than 0.667, an Al deficient portion can be present. It is believed that the aluminum oxide forming the passivation layer of this embodiment generates a negative fixed charge density due to the compositional deficiency of Al. In such a case, it is presumed that the aluminum oxide has a nonstoichiometric composition and has an amorphous structure similar to that of γ alumina. This has been confirmed by, for example, transmission electron microscopy (TEM) or electron energy-loss spectroscopy (EELS).

In the aluminum oxide of this embodiment, the negative fixed charge density is enhanced with an increase in the compositional deficiency of Al. In order to produce the first passivation layer 5, however, the lower limit of the compositional deficiency of Al as aluminum oxide having a nonstoichiometric composition is shown as a composition of about $Al_{1.9}O_{3.1}$. Such suppression of Al deficiency can prevent the film density (compactness) of aluminum oxide from being excessively decreased and hardly deteriorate the film quality. That is, electric leakage hardly occurs, and humidity resistance is hardly decreased. Consequently, the aluminum oxide film can have satisfactory quality and, thereby, can maintain the characteristics and long-term reliability of the solar cell element. In this $Al_{1.9}O_{3.1}$, the first ratio $R_{Al/O}$ is about 0.613 (≈1.9/3.1). Aluminum oxide having a first ratio $R_{Al/O}$ of 0.613 or more and less than 0.667 has a large negative fixed charge density.

If the aluminum oxide contains, for example, hydrogen (H) or CHn (n denotes a natural number), the dangling bonds of silicon (Si) in the first semiconductor region 2 are terminated by H, OH, CHn (n denotes a natural number), O, or other elements at the interface between the first passivation layer 5 and the first semiconductor region 2. That is, the effect of passivation is increased by a reduction in the interface state density.

In aluminum oxide having a simple deficiency of Al, electron vacancy is formed in the 2p orbit of O at the Al deficient portion. That is, an acceptor level is generated. In this case, in the first principles calculation, the fixed charge Q at the Al deficient portion is −3 by receiving electrons from silicon to which aluminum oxide is conjugated due to the deficiency of trivalent Al. In contrast, in aluminum oxide containing H, the H can be present between the Al deficient portion and the aluminum oxide lattice. Accordingly, in the aluminum oxide, monovalent H can form a bond (OH bond) with O in the Al deficient portion. On this occasion, the fixed charge Q at the Al deficient portion decreases from −3 to −2. It is, however, presumed that the instability of the Al deficient portion is eased by the OH bond. Consequently, the stability of aluminum oxide having a nonstoichiometric composition containing an Al deficiency is increased. As a result, for example, the Al deficient portion in the aluminum oxide hardly disappears even if heat treatment is performed in the formation of the antireflection layer 7, the first electrode 8, and the second electrode 9, after the formation of the first passivation layer 5.

Here, when the H atomic density is not lower than the number of the Al deficient portions in aluminum oxide, H and O bind to each other at almost all of the Al deficient portions to increase the stability of the Al deficient portions. In such aluminum oxide, the stability of the Al deficiency protions is increased as long as the ratio of the sum of the Al atomic density and the H atomic density to the O atomic density, i.e., the second ratio, $R_{(Al+H)/O}$, obtained by dividing the sum of the Al atomic density and the H atomic density by the O atomic density is 2/3 or more, specifically, 0.667 or more.

In this case, the mechanism of generating a negative fixed charge on the aluminum oxide side is believed, for example, as follows:

Primary reaction Si:Si/Al:O:H→Si.Si/Al:O:+.H 

Secondary reaction .H+.H→H:H 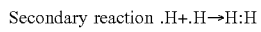

Secondary reaction Al:O:CH$_3$+.H→Al:O:H+.CH$_3$ 

In the reaction formulae, the symbol "." represents an electron, and the symbol "/" represents an interface. The multiple secondary reactions mentioned above simultaneously proceed.

In the primary reaction, an electron moves from the Si side to the aluminum oxide side to generate a positive charge on the Si side and a negative charge on the aluminum oxide side.

The positive charge generated on the Si side acts such that the band of Si is bent upward toward the interface. That is, a potential barrier against the electrons as the minority carriers present at the conduction band is generated to inhibit the electrons from flowing into the interface and disappearing by recombination. In other words, an effect of increasing the effective lifetime of minority carriers is achieved (field-effect passivation).

Meanwhile, the negative charge generated on the aluminum oxide side is fixed, i.e., becomes into a negative fixed charge in the aluminum oxide in the vicinity of the interface. This negative fixed charge in the aluminum oxide is significantly stable and is therefore not lost even in the process for producing a solar cell element (e.g., a high-temperature process such as firing). That is, the presence of the stable negative fixed charge secures the stability of the positive charge on the Si side (stability of field-effect passivation).

The mechanism described above bends the energy band such that the electronic energy in the first semiconductor region 2 increases toward the interface with the first passivation layer 5. Consequently, the passivation effect by a built-in electric field is enhanced. Furthermore, in this first passivation layer 5, the passivation effect by a built-in electric field is enhanced by appropriately controlling, for example, the composition.

In the aluminum oxide, a higher content of H allows easy binding of H to O in almost all of the Al deficient portions. In order to produce the first passivation layer 5, however, the upper limit of the H content is an aluminum oxide having a composition of about $(Al+H)_{2.2}O_{2.8}$ as aluminum oxide having a nonstoichiometric composition. Such an upper limit can prevent the film density (compactness) of aluminum oxide from being excessively decreased to hardly deteriorate the film quality. That is, electric leakage hardly occurs, and humidity resistance is hardly decreased. Consequently, the characteristics and long-term reliability of the solar cell element can be maintained.

The second ratio $R_{(Al+H)/O}$ of $(Al+H)_{2.2}O_{2.8}$ is about 0.786 (≈2.2/2.8). Accordingly, the stability of the Al deficient portions in the aluminum oxide having a nonstoichiometric composition is enhanced as long as the second ratio $R_{(Al+H)/O}$ is 0.667 or more and less than 0.786. That is, the passivation effect by the aluminum oxide is stably generated.

The results described above demonstrate that in the inside of the first passivation layer 5, passivation effect by aluminum oxide is stably generated when the first ratio $R_{Al/O}$ is 0.613 or more and less than 0.667 and the second ratio $R_{(Al+H)/O}$ is 0.667 or more and less than 0.786. As a result, the effective lifetime necessary for recombination of minority carriers in the first semiconductor region 2 is prolonged.

That is, the improvement in the passivation effect further enhances the conversion efficiency of the solar cell element 10.

Here, the inside of the first passivation layer 5 may be, for example, the inner portion of the first passivation layer 5 excluding the vicinities of both principal surfaces in the thickness direction. That is, the inside of the first passivation layer 5 does not include the vicinity of the interface with the first semiconductor region 2. Alternatively, the inside of the first passivation layer 5 may be the central portion of the first passivation layer 5 in the thickness direction. In addition, in the first passivation layer 5, the vicinity of the interface with the first semiconductor region 2 can be, for example, a region of the first passivation layer 5 defined by the thickness ranging from about 3 nm to 10 nm from the interface. If the thickness of the first passivation layer 5 is 10 nm or less, almost the entire thickness may be recognized as the vicinity of the interface.

When the first ratio $R_{Al/O}$ of the first passivation layer 5 in the vicinity of the interface with the first semiconductor region 2 is higher than the first ratio $R_{Al/O}$ of the first passivation layer 5 in the central portion in the thickness direction, the passivation effect by a built-in electric field and the passivation effect by an interface state density, i.e., by the termination of dangling bonds of Si at the interface are enhanced. That is, the effective lifetime of the first semiconductor region 2 is prolonged to further enhance the conversion efficiency of the solar cell element 10.

In the first passivation layer 5 containing carbon (C), the passivation effect is enhanced. For example, in the first passivation layer 5, the sum (total atomic density) $A_{H+C}$ of the atomic density $A_H$ of H and the atomic density $A_C$ of C in the vicinity of the interface with the first semiconductor region 2 can be higher than the total atomic density $A_{H+C}$ at the central portion in the thickness direction of the first passivation layer 5. In this case, the dangling bonds of Si as the semiconductor material of the first semiconductor region 2 can be terminated by methyl groups at the interface between the first passivation layer 5 and the first semiconductor region 2. Consequently, the passivation effect by the first passivation layer 5 is further enhanced. As a result, the effective lifetime of the first semiconductor region 2 is prolonged to further enhance the conversion efficiency of the solar cell element 10.

Furthermore, the effective lifetime of the first semiconductor region 2 can be prolonged in proportion to the atomic density $A_H$ of H and the atomic density $A_C$ of C of the first passivation layer 5 in the central portion in the thickness direction and in the vicinity of the interface with the first semiconductor region 2.

Here, it is presumed that an increase in the atomic density $A_H$ of H stabilizes the Al deficient portions in aluminum oxide and causes termination of the dangling bonds of Si in the interface by, for example, H, OH, CHn (n denotes a natural number), or O to prolong the effective lifetime of the first semiconductor region 2, whereas the mechanism of prolonging the effective lifetime of the first semiconductor region 2 as an increase in the atomic density $A_C$ of C is unclear. It is, however, presumed that when the first passivation layer 5 is formed by the ALD method using TMA as a raw material, the content of CHn (n denotes a natural number) in the passivation layer 5 is increased for increasing the atomic density $A_H$ of H, which also increases the atomic density $A_C$ of C. The CHn may be supplied in other forms such as methane gas, instead of the supply by TMA.

In addition, in the first passivation layer 5, the ratio (the value obtained by dividing the H atomic density by the C atomic density: hereinafter, referred to as third ratio) $R_{H/C}$ of the H atomic density to the C atomic density in the vicinity of the interface with the first semiconductor region 2 can be higher than the third ratio $R_{H/C}$ in the central portion in the thickness direction of the first passivation layer 5. In this case, since the passivation effect is improved, the effective lifetime of the first semiconductor region 2 is prolonged to further enhance the conversion efficiency of the solar cell element 10.

Here, when the first passivation layer 5 is formed by the ALD method, in the first passivation layer 5, the third ratio $R_{H/C}$ is higher than 1 in the vicinity of the interface with the first semiconductor region 2. Consequently, it is presumed that in the first passivation layer 5, H is mainly in a form of H (or OH) or CHn (n denotes a natural number) in the vicinity of the interface with the first semiconductor region 2. In contrast, the third ratio $R_{H/C}$ is less than 1 in the region ranging from the central portion to the first principal surface 10a in the thickness direction of the first passivation layer 5. Consequently, it is presumed that H is mainly in a form of H (or OH) and C is mainly bonded to Al or O in the region ranging from the central portion to the first principal surface 10a in the thickness direction of the first passivation layer 5.

In this case, it is therefore presumed that the dangling bonds of Si as the semiconductor material of the first semiconductor region 2 is terminated by, for example, methyl groups at the interface between the first passivation layer 5 and the first semiconductor region 2. Such a structure further enhances the passivation effect by the first passivation layer 5. As a result, the effective lifetime of the first semiconductor region 2 is prolonged to further enhance the conversion efficiency of the solar cell element 10.

(1-3) Solar Cell Module

The solar cell module 100 according to an embodiment includes one or more solar cell elements 10. For example, the solar cell module 100 may include a plurality of electrically connected solar cell elements 10. Such a solar cell module 100 is formed by, for example, connecting a plurality of solar cell elements 10 in series and in parallel when the electrical output of each solar cell element 10 is low. For example, a practical electrical output can be extracted by combining a plurality of solar cell modules 100. An example of a solar cell module 100 including a plurality of solar cell elements 10 will now be described.

As shown in FIG. 4, the solar cell module 100 includes laminate of, for example, a transparent member 104, a front filler 102, a plurality of solar cell elements 10, a wiring member 101, a back filler 103, and a back protective material 105. Here, the transparent member 104 is a member for protecting the light-receiving surface of the solar cell module 100 receiving sunlight. The transparent member 104 may be any transparent tabular member, and the material of the transparent member 104 is, for example, glass. The front filler 102 and the back filler 103 can be, for example, transparent fillers. The materials of the front filler 102 and the back filler 103 are, for example, an ethylene-vinyl acetate copolymer (EVA). The back protective material 105 is a member for protecting the solar cell module 100 from the back. The material of the back protective material 105 is, for example, a polyethylene terephthalate (PET) or polyvinyl fluoride (PVF) resin. The back protective material 105 may have a single layer structure or a layered structure.

The wiring member 101 is a member (connecting member) for electrically connecting the plurality of solar cell elements 10. In the solar cell elements 10 adjacent to each other in the Y direction of the solar cell module 100, the first electrode 8 of one solar cell element 10 is connected to the second electrode 9 of the other solar cell element 10 with the wiring member 101. Consequently, a plurality of the solar cell elements 10 are electrically connected in series. Here, the wiring member 101 can have a thickness of, for example, about 0.1 mm or more and 0.2 mm or less and can have a width of, for example, about 2 mm. The wiring member 101 can be a member such as copper foil entirely coated with solder.

In the solar cell elements 10 electrically connected in series, one end of the electrode of one outermost solar cell element 10 and one end of the electrode of the other outermost solar cell element 10 are electrically connected to a terminal box 107 serving as an output extraction portion with output extraction wiring 106 respectively. Furthermore, as shown in FIG. 5, the solar cell module 100 may be provided with a frame 108 (not shown in FIG. 4) for holding the laminate from the periphery. The material of the frame 108 is, for example, aluminum having both high corrosion resistance and high strength.

When the material of the front filler 102 is EVA, since EVA contains vinyl acetate, penetration of moisture or water at high temperature may generate acetic acid due to hydrolysis with time. In contrast, in this embodiment, since the antireflection layer 7 is disposed on the second passivation layer 6, the damage on the solar cell element 10 caused by acetic acid is reduced. As a result, the reliability of the solar cell module 100 is secured for a long time.

When at least one of the materials of the front filler 102 and the back filler 103 is EVA, an acid acceptor such as magnesium hydroxide or calcium hydroxide may be added to the EVA. Consequently, the generation of acetic acid from EVA is reduced to enhance the durability of the solar cell module 100 and reduce the damage on the first passivation layer 5 and the second passivation layer 6 by acetic acid. As a result, the reliability of the solar cell module 100 is secured for a long time.

(1-4) Method of Producing Solar Cell Element

Figure 6:
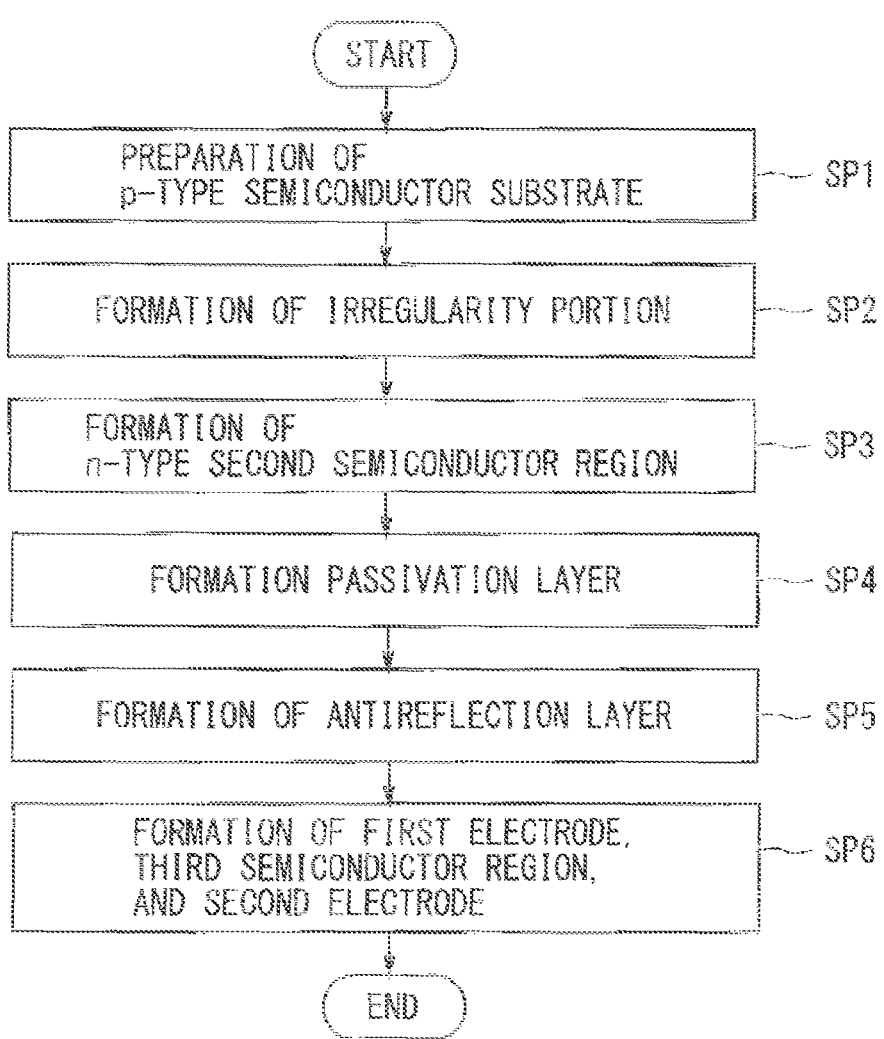
FIG. 6 is a flow chart for the production of a solar cell element according to an embodiment of the present invention.

An example of a process of producing a solar cell element 10 having the structure described above will now be described. As shown in FIG. 6, the solar cell element 10 is produced by carrying out the steps SP1 to SP6 in order.

In step SP1, a p-type semiconductor substrate 1 is prepared. Here, when the semiconductor substrate 1 is a single crystalline silicon substrate, for example, the semiconductor substrate 1 is formed by, for example, a floating zone (FZ) method. When the semiconductor substrate 1 is a polycrystalline silicon substrate, the semiconductor substrate 1 is formed by, for example, casting. An example using a p-type polycrystalline silicon substrate as the semiconductor substrate 1 will now be described. First, for example, an ingot of polycrystalline silicon as a semiconductor material is produced by casting. Then, the ingot is cut into semiconductor substrates 1 having a thickness of, for example, 250 μm or less. The surfaces of the semiconductor substrate 1 are then extremely slightly etched with an aqueous solution of, for example, NaOH, KOH, hydrofluoric acid, or fluonitric acid to remove the mechanically damaged or contaminated layers from the cutting planes of the semiconductor substrate 1.

In step SP2, an irregularity portion is formed on the second principal surface 1b of both the first and second principal surfaces 1a and 1b of the semiconductor substrate 1. The irregularity portion is formed, for example, by wet etching using an alkaline solution of NaOH or the like or an acid solution of fluonitric acid or the like or by dry etching using reactive ion etching (RIE) or the like.

In step SP3, a second semiconductor region 3 showing n-type conduction is formed on the second principal surface 1b provided with the irregularity portion of the semiconductor substrate 1. The second semiconductor region 3 can have a thickness of about 0.2 μm or more and 2 μm or less. The second semiconductor region 3 can have a sheet resistance of about 40Ω/□ or more and 200Ω/□ or less. The second semiconductor region 3 can be formed by, for example, an application thermal diffusion method in which $P_2O_5$ in a paste form is applied to the surface of the semiconductor substrate 1 and is then subjected to thermal diffusion or a gas-phase thermal diffusion method in which $POCl_3$ (phosphorus oxychloride) in a gas state is used as a diffusion source.

Here, for example, when the gas-phase thermal diffusion method is employed, the semiconductor substrate 1 is heat-treated in an atmosphere containing a diffusion gas such as $POCl_3$ at a temperature range of about 600° C. or more and 800° C. or less. Consequently, phosphorus glass is formed on the second principal surface 1b of the semiconductor substrate 1. The heat treatment time can be, for example, about 5 minutes or more and 30 minutes or less. The semiconductor substrate 1 is then subjected to heat treatment at a high-temperature range of about 800° C. or more and 900° C. or less in an atmosphere containing an inert gas such as argon or nitrogen. Consequently, phosphorus diffuses from the phosphorus glass to a region on the second principal surface 1b side of the semiconductor substrate 1 to form the second semiconductor region 3. The heat treatment time can be, for example, about 10 minutes or more and 40 minutes or less.

During the formation of the second semiconductor region 3, if a second semiconductor region 3 is also formed on the first principal surface 1a side of the semiconductor substrate 1, the second semiconductor region 3 formed on the first principal surface 1a side may be removed by etching. Consequently, the semiconductor region 2 showing p-type conduction is exposed on the first principal surface 1a of the semiconductor substrate 1. For example, the second semiconductor region 3 formed on the first principal surface 1a side is removed by immersing only the first principal surface 1a side of the semiconductor substrate 1 in a solution of fluonitric acid. Then, the phosphorus glass formed on the second principal surface 1b side of the semiconductor substrate 1 may be removed by etching. By removing the second semiconductor region 3 formed on the first principal surface 1a side in a state that the phosphorus glass remains on the second principal surface 1b of the semiconductor substrate 1, the second semiconductor region 3 on the second principal surface 1b side is prevented from being removed, and from being damaged. On this occasion, the second semiconductor region 3 formed on the side surface 1c of the semiconductor substrate 1 may be also removed in a state that the phosphorus glass remains on the second principal surface 1b of the semiconductor substrate 1.

Alternatively, the second semiconductor region 3 may be formed by, for example, a gas-phase thermal diffusion method in a state that a diffusion mask is disposed on the first principal surface 1a of the semiconductor substrate 1 and then removing the diffusion mask. In such a process, no second semiconductor region 3 is formed on the first principal surface 1a side of the semiconductor substrate 1. Consequently, a process of removing a second semiconductor region 3 formed on the first principal surface 1a side of the semiconductor substrate 1 is not necessary.

The method of forming the second semiconductor region 3 is not limited to those described above. For example, an n-type hydrogenated amorphous silicon film, a crystalline silicon film including a microcrystalline silicon film or the like may be formed by a thin-film technology. Furthermore, a silicon region showing i-type conduction may be formed between the first semiconductor region 2 and the second semiconductor region 3.

Subsequently, before the formation of a first passivation layer 5 on the first principal surface 1a of the first semiconductor region 2 and before the formation of a second passivation layer 6 on the second principal surface 1b of the second semiconductor region 3, the surfaces of the first principal surface 1a and the second principal surface 1b may be cleaned with, for example, a combination of nitric acid, hydrofluoric acid, and pure water. Consequently, for example, metal elements such as Na, Cr, Fe, and Cu and natural oxide films, which adversely affect the electrical characteristics of solar cell elements, are preferably removed as much as possible.

The cleaning treatment can be performed by, for example, cleaning the first principal surface 1a and the second principal surface 1b with nitric acid at room temperature to about 110° C. for removing the metal elements mentioned above, then rinsing the acid away with pure water, further cleaning the first principal surface 1a and the second principal surface 1b with dilute hydrofluoric acid for removing natural oxide films, and then rinsing the acid away with pure water. This cleaning treatment can reduce each of metal elements such as Cr, Fe, and Cu to $5 \times 10^{10}$ atoms/cm$^3$ or less.

In the subsequent step SP4, a first passivation layer 5 is formed on the first principal surface 1a of the first semiconductor region 2, and a second passivation layer 6 is formed on the second principal surface 1b of the second semiconductor region 3. The first passivation layer 5 and the second passivation layer 6 can be formed by, for example, an ALD method. Consequently, the first passivation layer 5 and the second passivation layer 6 are formed on all surfaces of the semiconductor substrate 1 at the same time. That is, a passivation layer containing an aluminum oxide layer is also formed on the side surface 1c of the semiconductor substrate 1.

In the ALD method, the semiconductor substrate 1 provided with the second semiconductor region 3 in step SP3 is placed in the chamber of a film-forming apparatus, and the following processes A to D are repeated in a state that the semiconductor substrate 1 is heated at a temperature range of 100° C. or more and 250° C. or less. Consequently, the first passivation layer 5 and the second passivation layer 6 having desired thicknesses are formed.

[Process A] An Al material is adsorbed onto all surfaces of the semiconductor substrate 1 by supplying the Al material such as TMA together with a carrier gas, such as Ar gas or N$_2$ gas, onto the semiconductor substrate 1. On this occasion, the surface of the semiconductor substrate 1 is desirably terminated with OH groups. That is, in a case of a Si substrate, the surface desirably has Si—O—H when an Al material such as TMA is first supplied. This structure can be formed by, in addition to the above-described cleaning treatment, for example, conditions for rinsing with pure water in the process of treating a Si substrate with dilute hydrofluoric acid, and subsequent treatment with an oxidizing solution such as nitric acid, or subsequent treatment with ozone. The time for supplying TMA can be, for example, about 15 msec or more and 3000 msec or less. In the process A, the following reaction occurs:

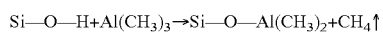

[Process B] The Al material in the chamber and also the Al material that has been physically or chemically adsorbed to the semiconductor substrate 1 but has not been chemically adsorbed at an atomic layer level are removed by purging the chamber of the film-forming apparatus with N$_2$ gas. The time for purging the chamber with N$_2$ gas can be, for example, about one second or more and several ten seconds or less.

[Process C] The methyl group as the alkyl group contained in TMA is removed and is replaced with an OH group by supplying water or an oxidizing agent such as O$_3$ gas into the chamber of the film-forming apparatus. That is, the following reaction occurs:

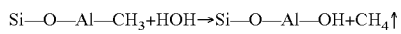

Here, exactly, "Si—O—Al—CH$_3$" in the left side should be expressed as "Si—O—Al(CH$_3$)$_2$", but since the notation becomes complicated, the above-mentioned reaction formula expresses only a reaction of one CH$_3$.

Consequently, an aluminum oxide atomic layer is formed on the semiconductor substrate 1. The time for supplying the oxidizing agent into the chamber may be about 750 msec or more and 1100 msec or less. In addition, for example, supply of H together with the oxidizing agent into the chamber allows the aluminum oxide to easily contain H.

[Process D] The purging of the chamber of the film-forming apparatus with N$_2$ gas removes the oxidizing agent in the chamber. At the same time, for example, the oxidizing agent and other materials that have not contributed to the reaction for forming aluminum oxide at an atomic layer level on the semiconductor substrate 1 are also removed. The time of purging the chamber with N$_2$ gas can be, for example, about one second.

Subsequently, process A is performed again to cause the following reaction:

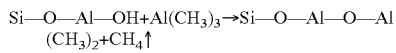

Furthermore, process B, process C, and process D are performed, and an aluminum oxide film having a desired thickness is formed by repeating processes A to D.

Thus, even if the surface of the semiconductor substrate 1 has fine irregularities, an aluminum oxide layer is uniformly formed along the irregularities by forming the first passivation layer 5 and the second passivation layer 6 by the ALD method. Consequently, the passivation effect on the surface of the semiconductor substrate 1 is enhanced.

Subsequently, in step SP5, an antireflection layer 7 is formed on the second passivation layer 6 formed on the second principal surface 1b of the semiconductor substrate 1. The antireflection layer 7 can be formed by, for example, a plasma enhanced chemical vapor deposition (PECVD) method, ALD method, evaporation method, or sputtering method. For example, when the PECVD method is employed, a gas mixture of SiH$_4$ gas and NH$_3$ gas is diluted with N$_2$ gas in a film-forming apparatus and is formed into plasma by glow discharge decomposition in the chamber, and silicon nitride is deposited on the second passivation layer 6. Consequently, an antireflection layer 7 containing silicon nitride is formed. The temperature in the chamber during the deposition of silicon nitride can be, for example, about 500° C. An antireflection layer 7 having a desired thickness can be formed in a short time by forming the antireflection layer 7 by a method other than the ALD method, such as a PECVD method, evaporation method, or sputtering method. Consequently, the productivity of the solar cell element 10 is enhanced.

Subsequently, in step SP6, a third semiconductor region 4, a first electrode 8, and a second electrode 9 are formed.

Figure 7:
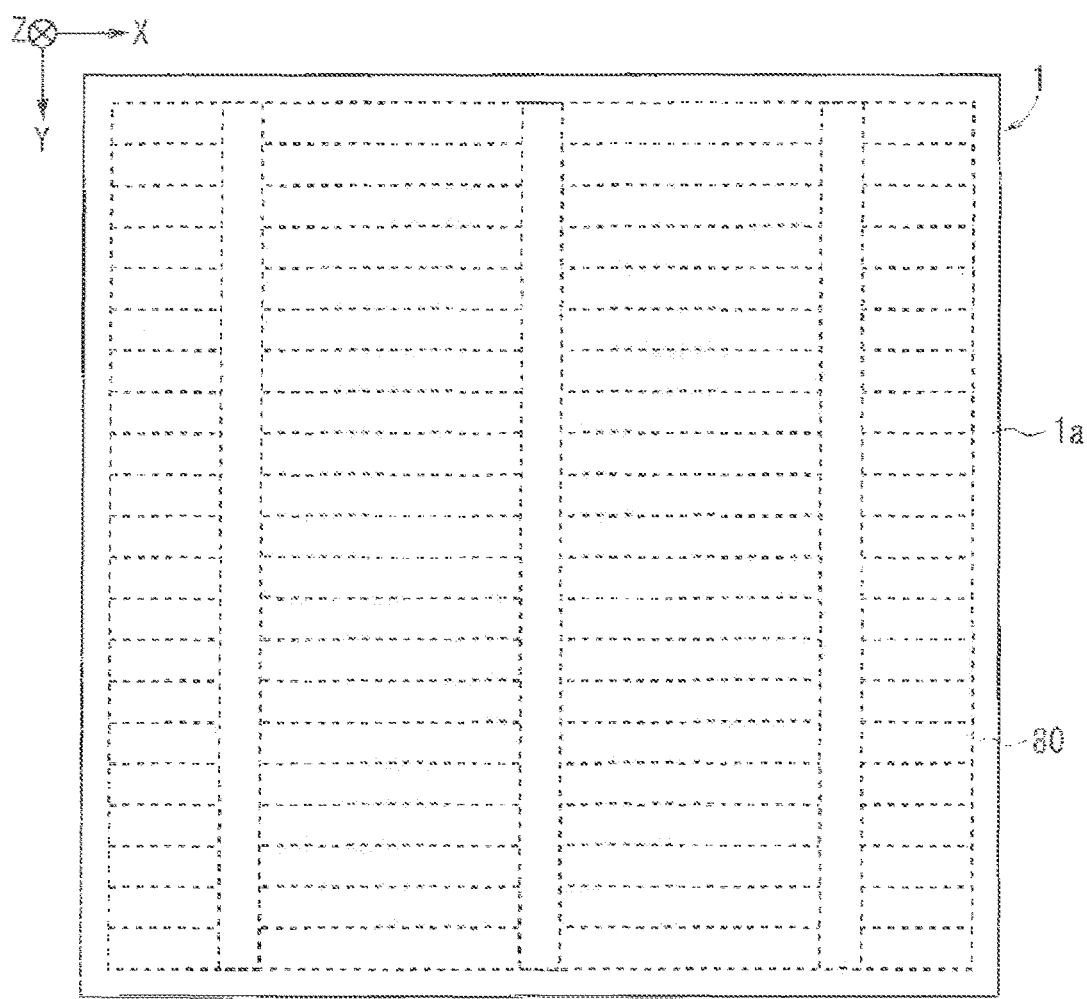
FIG. 7 is a plan view illustrating a region at which a third semiconductor region is formed in a solar cell element according to an embodiment of the present invention.

The methods of forming the third semiconductor region 4 and the first electrode 8 will now be described. An aluminum paste containing a glass frit and aluminum particles is first applied to a predetermined region of the first passivation layer 5. Subsequently, the components of the aluminum paste burst through the first passivation layer 5 by a fire-through method in which heat treatment at a high temperature range with a maximum temperature of 600° C. or more and 800° C. or less is performed to form the third semiconductor region 4 on the first principal surface 1a side of the semiconductor substrate 1. On this occasion, a layer of aluminum is formed on the first principal surface 1a of the third semiconductor region 4. This aluminum layer is used as a first collecting electrode 8b which is a part of the first electrode 8. The region where the third semiconductor region 4 is formed can be, as shown in FIG. 7, for example, a region along the broken line 80 defining the portion for forming the first collecting electrodes 8b and a part of the first output extraction electrodes 8a in the first principal surface 1a of the semiconductor substrate 1.

The first output extraction electrodes 8a are produced using, for example, a silver paste containing a metal powder mainly containing silver (Ag) and the like, an organic vehicle, and a glass frit. Specifically, a silver paste is applied onto the first passivation layer 5 and is then fired to form the first output extraction electrodes 8a. The maximum temperature of the firing can be, for example, 600° C. or more and 800° C. or less. In the firing, for example, the temperature is raised toward the peak temperature, is maintained at around the peak temperature for a predetermined time, and is then decreased. The time for the firing at around the peak temperature can be within several seconds. The method of applying a silver paste can be, for example, a screen printing method. After the application of the silver paste, the silver paste may be dried at a predetermined temperature to evaporate the solvent in the silver paste. The first output extraction electrodes 8a are brought into contact with the aluminum layer and are thereby electrically connected to the first collecting electrodes 8b.

The first collecting electrodes 8b may be formed after the formation of the first output extraction electrodes 8a. The first output extraction electrodes 8a may not be in direct contact with the semiconductor substrate 1, and the first passivation layer 5 may be present between the first output extraction electrode 8a and the semiconductor substrate 1. The aluminum layer formed on the third semiconductor region 4 may be removed. The first output extraction electrodes 8a and the first collecting electrodes 8b may be formed with the same silver paste.

A method of forming a second electrode 9 will now be described. The second electrode 9 is produced using, for example, a silver paste containing a metal powder mainly containing Ag and the like, an organic vehicle, and a glass frit. Specifically, a silver paste is applied onto the second passivation layer 6 of the semiconductor substrate 1 and is then fired to form the second electrode 9. The maximum temperature of the firing can be, for example, 600° C. or more and 800° C. or less. The time for the firing can be, for example, within about several seconds at the firing peak temperature. The method of applying a silver paste can be, for example, a screen printing method. After the application of the silver paste, the silver paste may be dried at a predetermined temperature to evaporate the solvent in the silver paste. The second electrode 9 includes second output extraction electrodes 9a and second collecting electrodes 9b, which can be formed by a single process at the same time by employing the screen printing method.

The first electrode 8 and the second electrode 9 may be formed by a single firing process after the application of the respective pastes. The first electrode 8 and the second electrode 9 exemplified above are formed by printing and firing. But it is not limited to thereto. The first electrode 8 and the second electrode 9 may be formed by any other method, for example, a thin film-forming method such as evaporation or sputtering or a plating method.

After the formation of the first passivation layer 5 and the second passivation layer 6, the maximum temperature of the heat treatment in each step is controlled to 800° C. or less, which enhances the passivation effects of the first passivation layer 5 and the second passivation layer 6. For example, in each step after the formation of the first passivation layer 5 and the second passivation layer 6, the time for heat treatment at a temperature range of 300° C. or more and 500° C. or less can be, for example, 3 minutes or more and 30 minutes or less.

(1-5) Conclusion of an Embodiment

As described above, in the inside of the first passivation layer 5, the first ratio $R_{Al/O}$ can be 0.613 or more and less than 0.667, and the second ratio $R_{(Al+H)/O}$ can be 0.667 or more and less than 0.786. Consequently, the passivation effect by aluminum oxide of the first passivation layer 5 is stably generated. As a result, the effective lifetime necessary for recombination of minority carriers in the first semiconductor region 2 is prolonged. That is, an improvement in the passivation effect by built-in electric field enhances the conversion efficiency in the solar cell element 10.

In the first passivation layer 5, the first ratio $R_{Al/O}$ in the vicinity of the interface with the first semiconductor region 2 can be higher than that in the central portion in the thickness direction of the first passivation layer 5. Consequently, the passivation effect of the built-in electric field by the aluminum oxide of the first passivation layer 5 and the passivation effect by the interface state density, i.e., the termination of the dandling bonds of Si at the interface are enhanced. That is, the effective lifetime of the first semiconductor region 2 is prolonged to further enhance the conversion efficiency of the solar cell element 10.

In the first passivation layer 5, the total atomic density $A_{H+C}$ of the atomic density $A_H$ of H and the atomic density $A_C$ of C in the vicinity of the interface with the first semiconductor region 2 can be higher than that in the central portion in the thickness direction of the first passivation layer 5. Consequently, the passivation effect by the interface state density, i.e., the termination of the dandling bonds of Si at the interface by aluminum oxide of the first passivation layer 5 is enhanced. That is, the effective lifetime of the first semiconductor region 2 is prolonged to further enhance the conversion efficiency of the solar cell element 10.

In the first passivation layer 5, the third ratio $R_{H/C}$ obtained by dividing the H atomic density by the C atomic density in the vicinity of the interface with the first semiconductor region 2 can be higher than the third ratio $R_{H/C}$ in the central portion in the thickness direction of the first passivation layer 5. Consequently, the passivation effect by the interface state density, i.e., the termination of the dandling bonds of Si at the interface by aluminum oxide of the first passivation layer 5 is enhanced. That is, the effective lifetime of the first semiconductor region 2 is prolonged to further enhance the conversion efficiency of the solar cell element 10.

(2) Modification

The present invention is not limited to an embodiment, and various changes and improvements are possible within a scope not depart from the gist of the present invention.

For example, in the above-described embodiment, the first passivation layer 5 is disposed on the non-light-receiving surface side of the solar cell element 10, but is not limited thereto. For example, in the semiconductor substrate 1, when the n-type semiconductor region is disposed on the non-light-receiving surface side and the p-type semiconductor region is disposed on the light-receiving surface side, the first passivation layer 5 can be disposed on the light-receiving surface side of the solar cell element 10.

The solar cell element 10 may be, for example, a back-contact type having a metal-wrap through structure in which the second output extraction electrodes 9a are disposed on the first principal surface 10a side.

It should be known that the components of the above-described embodiment and various modifications can be totally or partially combined appropriately within a range not causing a conflict. In addition, the passivation layer can be produced by a CVD method, as well as the ALD method.

EXAMPLES

Specific examples according to the above-described embodiment will now be described.

Preparation of Samples

Single crystalline silicon substrates each having sides of 156 mm and a thickness of about 200 μm and showing p-type conduction were prepared as semiconductor substrates 1. Here, an ingot of single crystalline silicon was formed by an FZ method. On this occasion, the single crystalline silicon was doped with B so as to show p-type conduction. Subsequently, the single crystalline silicon ingot was sliced into single crystalline silicon substrates, i.e., semiconductor substrates 1, such that the (100) plane of the silicon single crystal appeared on the first principal surface 1a and the second principal surface 1b of each semiconductor substrate 1. The surfaces of the semiconductor substrate 1 were extremely slightly etched with a ten times diluted aqueous solution of hydrofluoric acid to remove the mechanically damaged or contaminated layers from the cutting planes of the semiconductor substrate 1.

Subsequently, a first passivation layer 5 and a second passivation layer 6 mainly containing aluminum oxide were formed by an ALD method on all surfaces of the semiconductor substrate 1. Here, the semiconductor substrate 1 was placed in the chamber of a film-forming apparatus, and the temperature of the semiconductor substrate 1 was maintained at 175° C., 200° C., or 300° C. The steps A to D were repeated to form the first passivation layer 5 and the second passivation layer 6 having desired thicknesses. Subsequently, in order to investigate the influence of the heat treatment during the formation of the antireflection layer 7, the third semiconductor region 4, the first electrode 8, and the second electrode 9, each semiconductor substrate 1 provided with the first passivation layer 5 and the second passivation layer 6 was subjected to each heat treatment. As a result, samples S1 to S12 were produced.

Furthermore, a first passivation layer 5 and a second passivation layer 6 mainly containing aluminum oxide were formed on all surfaces of each semiconductor substrate 1 by a CVD method. Here, the semiconductor substrate 1 was placed in the chamber of a film-forming apparatus, and the temperature of the semiconductor substrate 1 was maintained at 150° C. or more and 250° C. or less to form the first passivation layer 5 and the second passivation layer 6 each having a thickness of 30 nm or more and 40 nm or less. Subsequently, in order to investigate the influence of the heat treatment during the formation of the antireflection layer 7, the third semiconductor region 4, the first electrode 8, and the second electrode 9, each semiconductor substrate 1 provided with the first passivation layer 5 and the second passivation layer 6 was fired at 810° C. in the firing furnace used for firing the first electrode 8 and the second electrode 9 in the atmosphere at a peak temperature of 810° C. for about 1 to 10 seconds. As a result, samples A1 and A2 were produced.

TABLE 1

| Sample | $N_2$ gas Flow rate (sccm) | $O_3$ gas Open time (msec) | $O_3$ gas Replacement time (sec) | TMA Open time (msec) | TMA Replacement time (sec) | Substrate temperature (° C.) | Film thickness (nm) | Post-treatment | Effective lifetime τ (μsec) |
|---|---|---|---|---|---|---|---|---|---|
| S1 | 100 | 750 | 15 | 75 | 15 | 175 | 35 | Annealing at 450° C. in $N_2$ gas | 280 |
| S2 | 100 | 750 | 15 | 1000 | 15 | 175 | 40 | Annealing at 450° C. in $N_2$ gas | 455 |
| S3 | 100 | 750 | 15 | 75 | 15 | 300 | 30 | Annealing at 450° C. in $N_2$ gas | 10 |
| S4 | 30 | 900 | 15 | 15 | 12 | 200 | 30 | Annealing at 450° C. in $N_2$ gas | 634 |
| S5 | 30 | 900 | 15 | 15 | 12 | 200 | 30 | Firing at 810° C. in the atmosphere | 97 |
| S6 | 30 | 900 | 15 | 15 | 12 | 200 | 30 | None | 5 |
| S7 | 30 | 1100 | 15 | 15 | 12 | 175 | 30 | Firing at 810° C. in the atmosphere | 1375 |
| S8 | 30 | 1100 | 15 | 15 | 12 | 175 | 30 | Firing at 765° C. in the atmosphere | 319 |
| S9 | 30 | 1100 | 15 | 15 | 12 | 175 | 30 | Firing at 765° C. in the atmosphere | 240 |
| S10 | 100 | 750 | 15 | 75 | 15 | 175 | 30 | Firing at 765° C. in the atmosphere | 358 |
| S11 | 100 | 750 | 15 | 75 | 15 | 175 | 40 | Firing at 765° C. in the atmosphere | 348 |
| S12 | 100 | 750 | 15 | 75 | 15 | 175 | 40 | Firing at 765° C. in the atmosphere | 508 |

The conditions for producing samples S1 to S12 are shown in Table 1.

As shown in Table 1, the temperature of each semiconductor substrate 1 of samples S1, S2, and S7 to S12 placed in the chamber of a film-forming apparatus was maintained at about 175° C. The temperature of the semiconductor substrate 1 of sample S3 was maintained at about 300° C., and the temperature of each semiconductor substrate 1 of samples S4 to S6 was maintained at about 200° C.

In process A of the ALD method, $N_2$ gas was used as the carrier gas. The flow rate of the $N_2$ gas introduced into the chamber was about 30 sccm for samples S4 to S9 and was about 100 sccm for samples S1 to S3 and S10 to S12. The time (open time) for supplying TMA into the chamber was about 15 msec for samples S4 to S9, about 75 msec for samples S1, S3, and S10 to S12, and about 1000 msec for sample S2.

In process B of the ALD method, the time (replacement time) from the completion of supply of TMA into the chamber to the start of process C was defined as the time for purging the chamber. The replacement time was about 12 sec for samples S4 to S9 and was about 15 sec for samples S1 to S3 and S10 to S12. The flow rate of the $N_2$ gas introduced into the chamber was about 30 sccm for samples S4 to S9 and was about 100 sccm for samples S1 to S3 and S10 to S12.

In process C of the ALD method, $O_3$ gas was used as the oxidizing agent. The volume of the $O_3$ gas introduced into the chamber was about 250 cc at standard conditions.

The time (open time) for supplying $O_3$ gas into the chamber was 750 msec for samples S1 to S3 and S10 to S12, was about 900 msec for samples S4 to S6 and was about 1100 msec for samples S7 to S9.

The concentration of the $O_3$ gas was 300 g/cm$^3$, and the $O_3$ gas was supplied once in each process C.

In process D of the ALD method, the time (replacement time) from the completion of supply of $O_3$ gas into the chamber to the start of subsequent process was defined as the time for purging the chamber. The replacement time was 15 sec for all samples S1 to S12. The flow rate of the $N_2$ gas introduced into the chamber was about 30 sccm for samples S4 to S9 and was about 100 sccm for samples S1 to S3 and S10 to S12.

The first passivation layer 5 and the second passivation layer 6 each had an average thickness of about 35 nm in sample S1, about 40 nm in samples S2, S11, and S12, and about 30 nm in samples S3 to S10. The average thicknesses were each determined as an average of thicknesses at five points of each of the first passivation layers 5 and the second passivation layers 6 measured with an ellipsometer (SE-400adv, manufactured by SENTECH Co., Ltd.).

The first passivation layer 5 and the second passivation layer 6 were heat-treated, for samples S1 to S4, by annealing the semiconductor substrate 1 at about 450° C. for 20 minutes in $N_2$ gas; for samples S5 and S7, by firing the semiconductor substrate 1 at a peak temperature of about 810° C. for about 1 to 10 seconds in the atmosphere; and for samples S8 to S12, by firing the semiconductor substrate 1 at a peak temperature of about 765° C. for 1 second or more and 10 seconds or less in the atmosphere.

Measurement of Composition and Effective Lifetime

Samples S1 to S5, A1, and A2 were used as subjects, and changes in the respective atomic densities $A_{Si}$, $A_{Al}$, $A_O$, $A_C$, and $A_H$ of Si, Al, O, C, and H depending on the depth from the surface of the first passivation layer 5 were measured. Samples S6 and S7 were used as subjects, and changes in the respective atomic densities $A_{Al}$ and $A_O$ of Al and O depending on the depth from the surface of the first passivation layer 5 were measured. In these measurements, a high-resolution analyzer employing rutherford backscattering spectroscopy (RBS) was used.

Samples S2, S3, S5, and S8 to S12 were used as subjects, and changes in the respective secondary ion intensities of O, Al, and Si and changes in the respective atomic densities of H, C, and N depending on the depth from the surface of the first passivation layer 5 were measured. In these measurements, a secondary ion mass spectrometer (SIMS) was used.

The effective lifetime τ of each of samples S1 to S12, A1, and A2 was also measured. In this measurement, a microwave photo conductivity decay (μ-PCD) method using lasers and microwaves was employed.

First Ratio and Second Ratio in the Inside of Passivation Layer

In sample S1, the respective atomic densities $A_{Si}$, $A_{Al}$, $A_O$, $A_C$, and $A_H$ of Si, Al, O, C, and H were substantially constant regardless of the depth in a range inside the first passivation layer 5 within a depth range of about 2 to 18 nm from the surface of the first passivation layer 5. In also samples S2 to 5, A1, and A2, similarly, the respective atomic densities $A_{Si}$, $A_{Al}$, $A_O$, $A_C$, and $A_H$ of Si, Al, O, C, and H were substantially constant regardless of the depth in a region in a certain depth range from the surface of the first passivation layer 5. It was surmised that in the region in a depth range of about 0 to 2 nm from the surface of the first passivation layer 5, the respective atomic densities $A_{Si}$, $A_{Al}$, $A_O$, $A_C$, and $A_H$ of Si, Al, O, C, and H were not substantially constant by influence of each element adhered to the surface of the first passivation layer 5.

Table 2 shows the atomic concentration values conveniently converted from the respective atomic densities $A_{Al}$, $A_O$, and $A_H$ of Al, O, and H, the first ratio $R_{Al/O}$, and the second ratio $R_{(Al+H)/O}$ in the region in which the respective atomic densities $A_{Si}$, $A_{Al}$, $A_O$, $A_C$, and $A_H$ of Si, Al, O, C, and H are substantially constant in samples S1 to S5, A1, and A2. Table 2 also shows the effective lifetimes τ of samples S1 to S5, A1, and A2. As described above, the first ratio $R_{Al/O}$ is a value obtained by dividing the Al atomic density $A_{Al}$ by the O atomic density $A_O$, and the second ratio $R_{(Al+H)/O}$ is a value obtained by dividing the sum of the Al atomic density $A_{Al}$ and the H atomic density $A_H$ by the O atomic density $A_O$.

TABLE 2

| Sample | Al (at %) | O (at %) | H (at %) | First ratio $R_{Al/O}$ (Al atomic density/ O atomic density) | Second ratio $R_{(Al+H)/O}$ (Al + H atomic density/ O atomic density) | Effective lifetime τ (μsec) |
|---|---|---|---|---|---|---|
| S1 | 38.0 | 59.2 | 2.8 | 0.642 | 0.689 | 280 |
| S2 | 37.7 | 58.9 | 3.4 | 0.640 | 0.698 | 455 |
| S3 | 40.3 | 59.2 | 0.5 | 0.681 | 0.689 | 10 |
| S4 | 38.3 | 59.4 | 2.2 | 0.645 | 0.682 | 634 |
| S5 | 39.8 | 59.7 | 0.5 | 0.667 | 0.675 | 97 |
| A1 | 36.8 | 58.2 | 5.1 | 0.632 | 0.719 | 561 |
| A2 | 36.6 | 58.7 | 4.7 | 0.624 | 0.704 | 310 |

As shown in Table 2, samples S3 and S5 each had a relatively short effective lifetime τ, shorter than 100 μsec. In contrast, samples S1, S2, S4, A1, and A2 each had a relatively long effective lifetime τ, longer than 200 μsec.

It was confirmed that in each of samples S1, S2, S4, A1, and A2 having relatively long effective lifetimes τ, longer than 200 μsec, the first ratio $R_{Al/O}$ in the inside of the first passivation layer 5 was less than 0.667. Specifically, it was confirmed that the first ratios $R_{Al/O}$ in the inside of the first passivation layers 5 of samples S1, S2, S4, A1, and A2 were 0.642, 0.640, 0.645, 0.632, and 0624, respectively.

In contrast, it was confirmed that in each of samples S3 and S5 having relatively short effective lifetimes τ, shorter than 100 μsec, the first ratio $R_{Al/O}$ in the inside of the first passivation layer 5 was 0.667 or more. Specifically, it was confirmed that the first ratios $R_{Al/O}$ inside the first passivation layers 5 of samples S3 and S5 were 0.681 and 0.667, respectively. Sample S3 was presumed that the first ratio $R_{Al/O}$ was increased due to the high temperature, 300° C., of the semiconductor substrate 1 during the formation of the first passivation layer 5. Sample S5 was presumed that the first ratio $R_{Al/O}$ was increased due to the generation of $H_2O$ by reaction O and H during the firing at about 810° C.

It was confirmed that in each of samples S1, S2, S4, A1, and A2 having relatively long effective lifetimes τ, longer than 200 μsec, the second ratio $R_{(Al+H)/O}$ in the inside of the first passivation layer 5 was 0.667 or more. Specifically, it was confirmed that the second ratios $R_{(Al+H)/O}$ in the inside of the first passivation layers 5 of samples S1, S2, S4, A1, and A2 were 0.689, 0.698, 0.682, 0.719, and 0.704, respectively. In contrast, it was confirmed that the second ratios $R_{(Al+H)/O}$ in the inside of the first passivation layers 5 of samples S3 and S5 having relatively short effective lifetimes τ, shorter than 100 μsec, were 0.689 and 0.675, respectively.

The results above demonstrate that a satisfactory effective lifetime can be obtained by satisfying the requirements of a first ratio $R_{Al/O}$ of 0.613 or more and less than 0.667 and a second ratio $R_{(Al+H)/O}$ of 0.667 or more and less than 0.786, in the inside of the first passivation layer 5. It was presumed that when these requirements are satisfied, a negative fixed charge is generated by Al deficiency in aluminum oxide, and the Al deficient portion is stabilized by a weak bond between H and O in the Al deficient portion. In addition, it is presumed that excessive H bonds to dangling bonds of the substrate surface by the heat energy in the subsequent process. That is, it was presumed that the passivation effect by a built-in electric field due to aluminum oxide of the first passivation layer 5 and the passivation effect by the interface state density, i.e., the termination of the dandling bonds of Si at the interface are stably generated to further enhance the conversion efficiency of the solar cell element.

Figure 8:
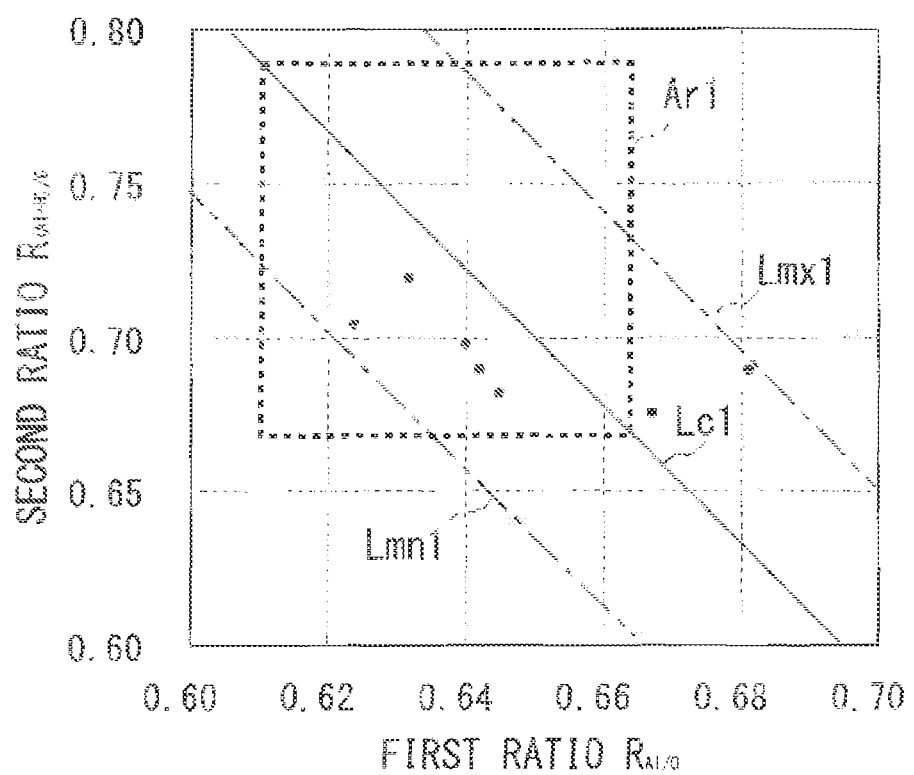
FIG. 8 is a graph showing a relationship between the first ratio and the second ratio in samples S1 to S5, A1, and A2.

FIG. 8 is a graph plotting a relationship between the first ratio $R_{Al/O}$ and the second ratio $R_{(Al+H)/O}$ in the inside of each first passivation layer 5 of samples S1 to S5, A1, and A2. In FIG. 8, the horizontal axis represents the first ratio $R_{Al/O}$, and the vertical axis represents the second ratio $R_{(Al+H)/O}$. In FIG. 8, the relationship between the first ratio $R_{Al/O}$ and the second ratio $R_{(Al+H)/O}$ in the inside of each first passivation layer 5 of samples S1 to S5, A1, and A2 is shown with seven black circles. The rectangular region surrounded by a dotted line Ar1 in FIG. 8 satisfies the first requirement that the first ratio $R_{Al/O}$ is 0.613 or more and less than 0.667 and the second ratio $R_{(Al+H)/O}$ is 0.667 or more and less than 0.786.

A diagonal line Lc1 of the rectangular region surrounded by the dotted line Ar1 is approximately expressed by an equation: $R_{(Al+H)/O} = -2 \times R_{Al/O} + 2$. As shown in FIG. 8, the seven black circles were confirmed to be included in the region between straight lines Lmx1 and Lmn1, where the line Lmx1 is defined by shifting the diagonal line Lc1 by 0.07 in the direction of increasing the second ratio $R_{(Al+H)/O}$ and the line Lmn1 is defined by shifting the diagonal line Lc1 by 0.07 in the direction of decreasing the second ratio $R_{(Al+H)/O}$. That is, it was confirmed that the second ratio $R_{(Al+H)/O}$ is included in a range of $-2 \times$ first ratio $R_{Al/O} + (2-0.07)$ or more and $-2 \times$ first ratio $R_{Al/O} + (2+0.07)$ or less. That is, the presence of a second requirement that the second ratio $R_{(Al+H)/O}$ is included in a range of $-2 \times R_{Al/O} + (2-0.07)$ or more and $-2 \times R_{Al/O} + (2+0.07)$ or less was confirmed. Accordingly, it was demonstrated that a satisfactory effective lifetime can be obtained when the aluminum oxide in the first passivation layer 5 satisfies, in addition to the first requirement, the second requirement.

Change in First Ratio in the Depth Direction of Passivation Layer

Figure 9:
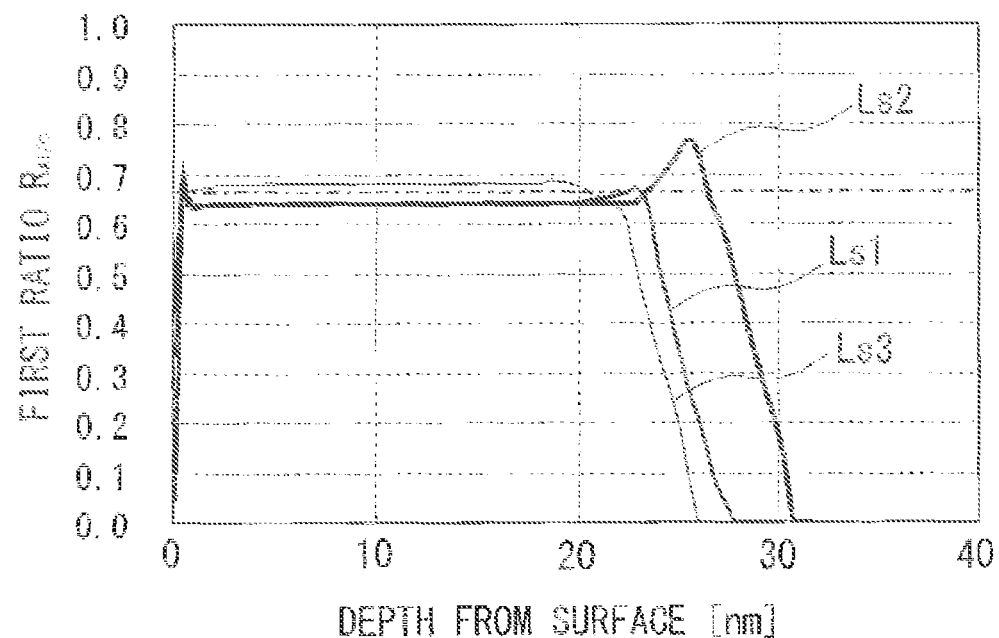
FIG. 9 is a graph showing a change in the first ratio depending on the depth from the surface of the first passivation layer in each of samples S1 to S3.
Figure 10:
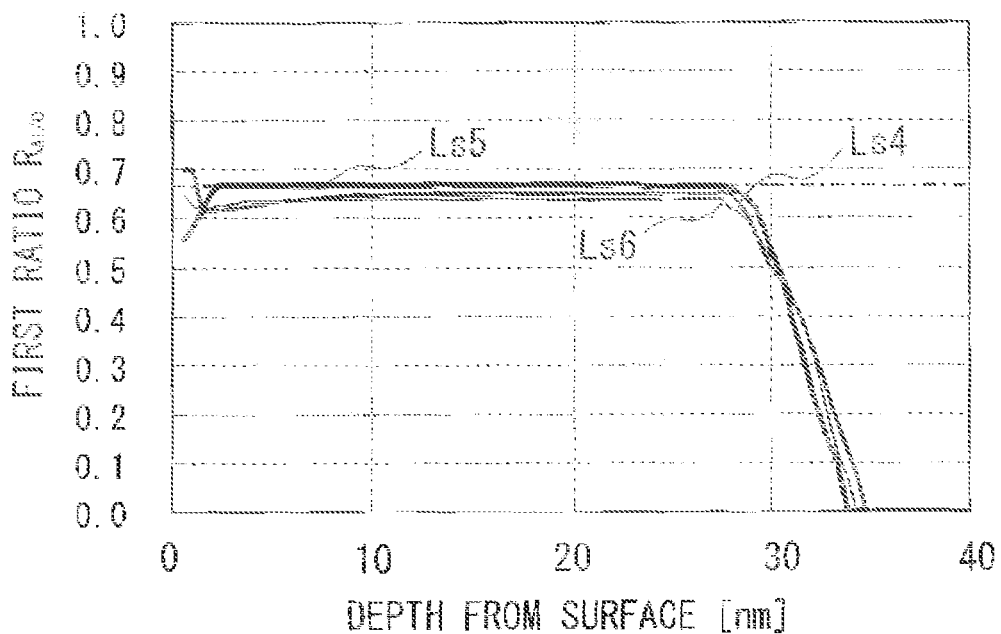
FIG. 10 is a graph showing a change in the first ratio depending on the depth from the surface of the first passivation layer in each of samples S4 to S6.
Figure 11:
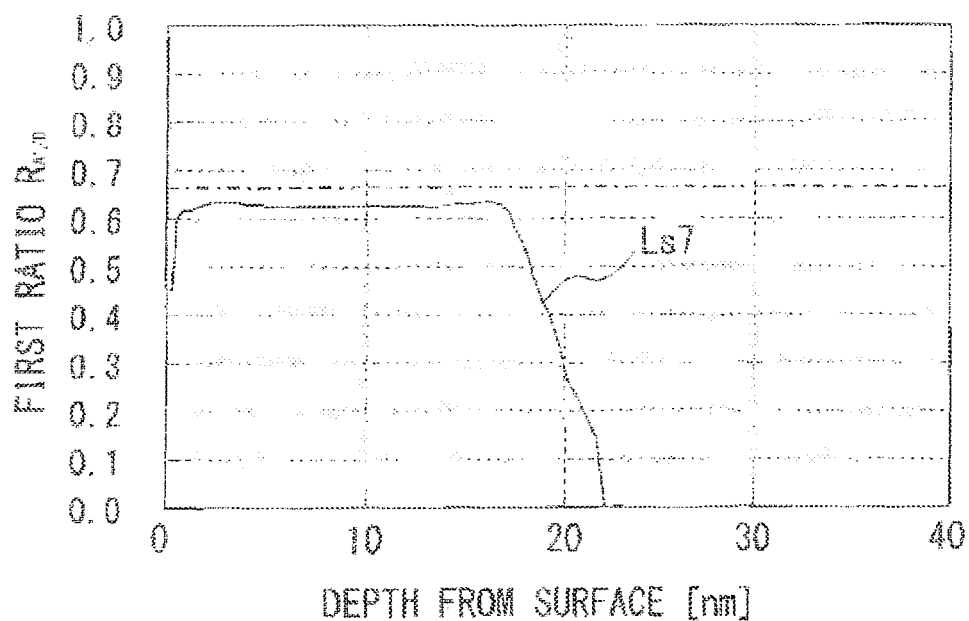
FIG. 11 is a graph showing a change in the first ratio depending on the depth from the surface of the first passivation layer in sample S7.

FIGS. 9 to 11 are graphs showing changes of the first ratio $R_{Al/O}$ depending on the depth from the surface of each first passivation layer 5 of samples S1 to S7. In FIGS. 9 to 11, the horizontal axis represents the depth from the surface of the first passivation layer 5, and the vertical axis represents the first ratio $R_{Al/O}$. In FIGS. 9 to 11, a first ratio $R_{Al/O}$ of 2/3 is indicated with an alternate long and short dash line, as a reference.

In FIG. 9, the curve Ls1 shows a change in the first ratio $R_{Al/O}$ of sample S1, the curve Ls2 shows a change in the first ratio $R_{Al/O}$ of sample S2, and the curve Ls3 shows a change in the first ratio $R_{Al/O}$ of sample S3. In FIG. 10, the curve Ls4 shows a change in the first ratio $R_{Al/O}$ of sample S4, the curve Ls5 shows a change in the first ratio $R_{Al/O}$ of sample S5, and the curve Ls6 shows a change in the first ratio $R_{Al/O}$ of sample S6. In FIG. 11, the curve Ls7 shows a change in the first ratio $R_{Al/O}$ of sample S7.

Figure 12:
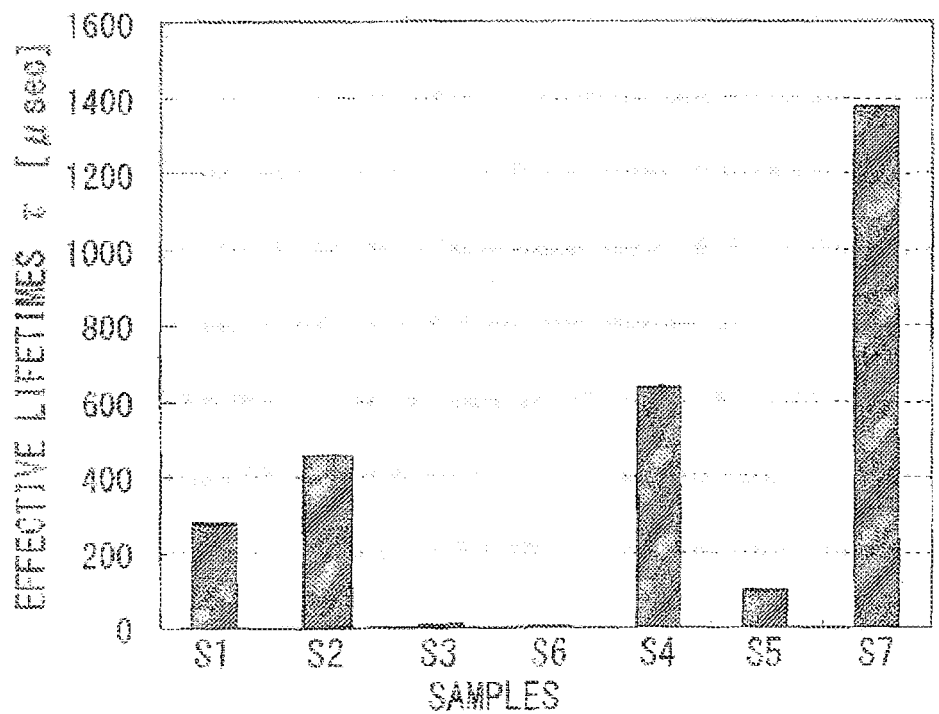
FIG. 12 is a graph showing the effective lifetimes of samples S1 to S7.

FIG. 12 is a bar graph showing the effective lifetimes τ of samples S1 to S7. As shown in FIG. 12, the effective lifetimes τ of samples S1, S2, S4, and S7 were relatively long time, 200 μsec or more, whereas the effective lifetimes τ of samples S3, S5, and S6 were relatively short, less than 100 μsec.

As shown in FIGS. 9 to 11, it was demonstrated that in samples S1, S2, S4, and S7 having relatively long effective lifetimes τ, the first ratio $R_{Al/O}$ notably increases in the first passivation layer 5 from the central portion in the thickness direction toward the interface with the first semiconductor region 2. In contrast, in samples S3, S5, and S6 having relatively short effective lifetimes τ, such an increase in the first ratio $R_{Al/O}$ was not observed in the first passivation layer 5 from the central portion in the thickness direction toward the interface with the first semiconductor region 2.

The results above demonstrated that a satisfactory effective lifetime τ can be obtained by satisfying a requirement that in the first passivation layer 5, the first ratio $R_{Al/O}$ in the vicinity of the interface with the first semiconductor region 2 is higher than the first ratio $R_{Al/O}$ in the central portion in the thickness direction of the first passivation layer 5.

Concentration Changes in H and C in the Depth Direction of Passivation Layer

Figure 13:
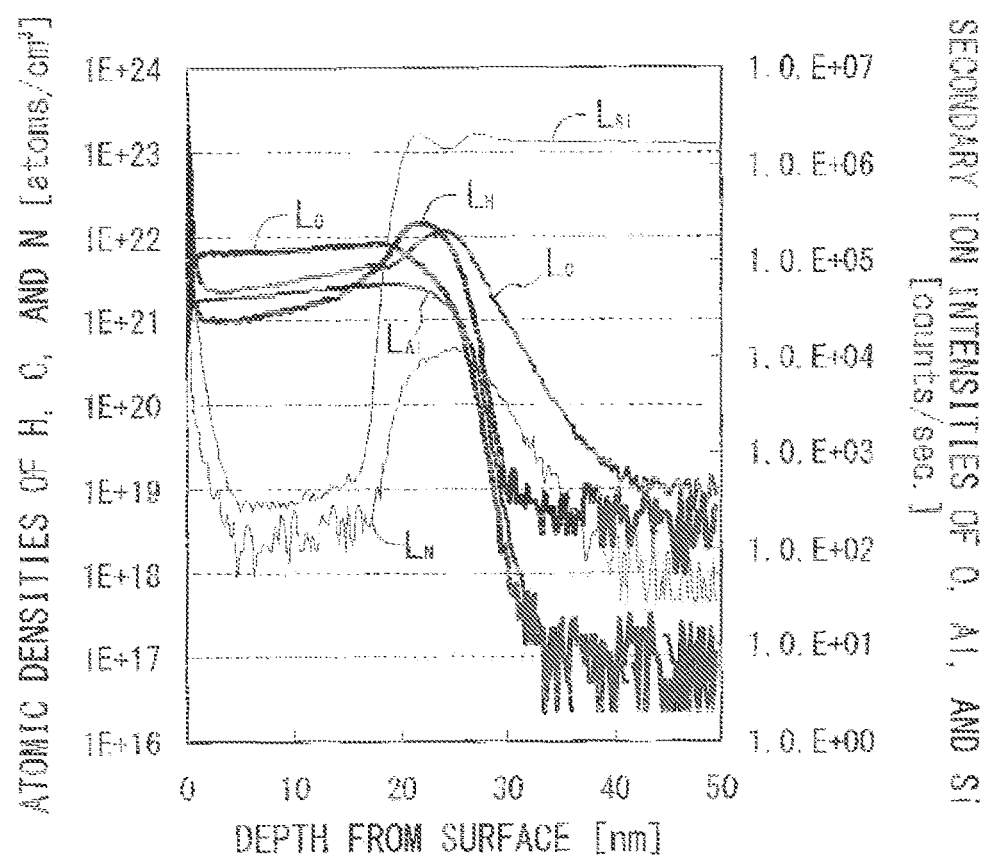
FIG. 13 is a graph showing the measurement results by SIMS of sample S9.

FIG. 13 is a graph showing the measurement results of sample S9 by SIMS. FIG. 13 shows changes in H, C, and N atomic densities and O, Al, and Si secondary ion intensities depending on the depth from the surface of the first passivation layer 5 in sample S9. Specifically, in FIG. 13, the curve $L_H$ drawn with a dark extra thick line shows a change in the H atomic density; the curve $L_C$ drawn with a dark thick line shows a change in the C atomic density; and the curve $L_N$ drawn with a dark thin line shows a change in N atomic density. In FIG. 13, the curve $L_O$ drawn with a light extra thick line shows a change in the O secondary ion intensity; the curve $L_{Al}$ drawn with a light thick line shows a change in the Al secondary ion intensity; and the curve $L_{Si}$ drawn with a light thin line shows a change in the Si secondary ion intensity.

As shown in FIG. 13, the total atomic density $A_{H+C}$ was increased from the central portion of the first passivation layer 5 in the thickness direction to the interface between the first semiconductor region 2 and the first passivation layer 5 where the changes in the Si, Al, and O secondary ion intensities are notable. That is, it was demonstrated that in the first passivation layer 5, the total atomic density $A_{H+C}$ in the vicinity of the interface with the first semiconductor region 2 is higher than the total atomic density $A_{H+C}$ in the central portion in the thickness direction of the first passivation layer 5.

Figure 14:
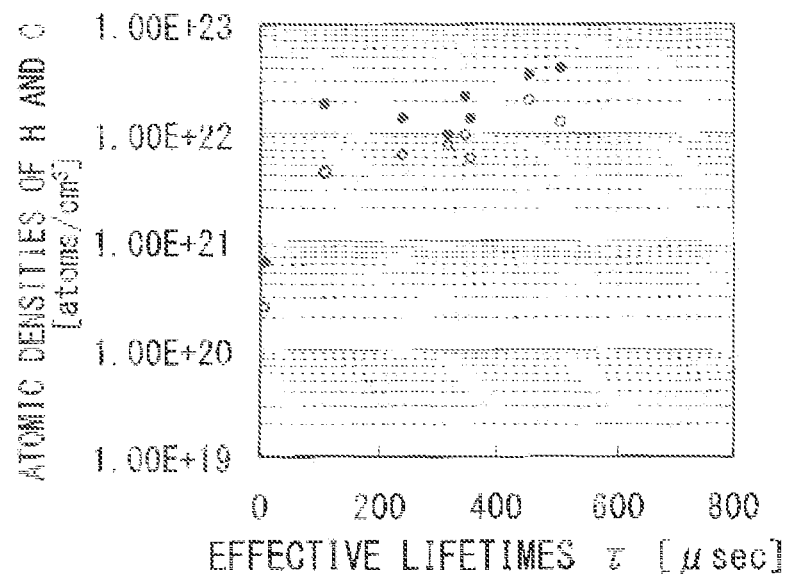
FIG. 14 is a graph showing a relationship between the atomic densities of hydrogen and carbon and the effective lifetime.
Figure 15:
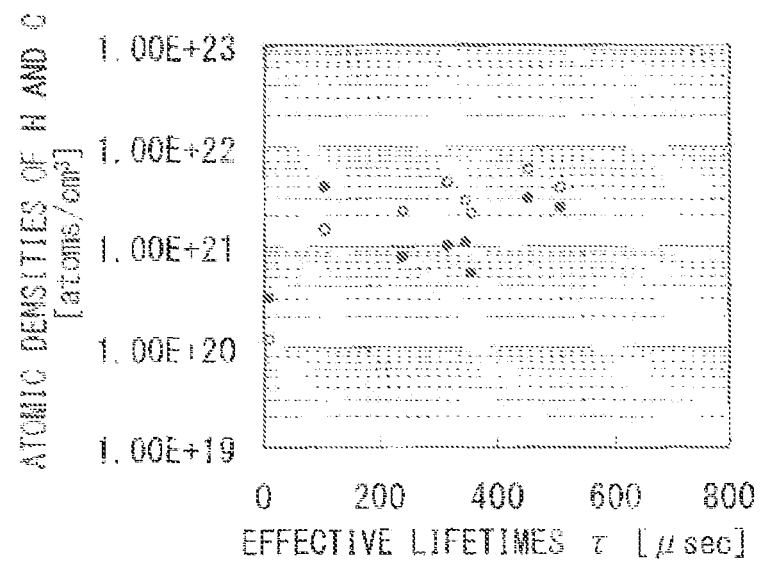
FIG. 15 is a graph showing a relationship between the atomic densities of hydrogen and carbon and the effective lifetime.

FIG. 14 is a graph showing a relationship between the H and C atomic densities and the effective lifetime τ in the first passivation layer 5 in the vicinity of the interface with the first semiconductor region 2 in samples S2, S3, S5, and S8 to S12. FIG. 15 is a graph showing a relationship between the H and C atomic densities and the effective lifetime τ in the central portion in the thickness direction of the first passivation layer 5 in samples S2, S3, S5, and S8 to S12. In FIGS. 14 and 15, the black circles show the H atomic densities, and the white circles show the C atomic densities.

As shown in FIGS. 14 and 15, it was confirmed that in the first passivation layer 5, the effective lifetime τ increases in proportion to the H and C atomic densities in both the vicinity of the interface with the first semiconductor region 2 and the central portion in the thickness direction. In addition, in samples S2 and S8 to S12 having relatively long effective lifetimes τ, 200 μsec or more, the H atomic density was higher than the C atomic density in the first passivation layer 5 in the vicinity of the interface with the first semiconductor region 2, and the atomic densities of H and C were both $5 \times 10^{20}$ atoms/cm$^3$ or more. In samples S2 and S8 to S12 having relatively long effective lifetimes τ, 200 μsec or more, the C atomic density was higher than the H atomic density in the central portion in the thickness direction of the first passivation layer 5, and the C atomic density was less than $1 \times 10^{22}$ atoms/cm$^3$.

It was also confirmed that in each first passivation layer 5 of samples S2 and S8 to S12 having long effective lifetimes τ, the total atomic density $A_{H+C}$ in the vicinity of the interface with the first semiconductor region 2 is about ten times higher the total atomic density $A_{H+C}$ in the central portion in the thickness direction. It was therefore confirmed that the passivation effect by the first passivation layer 5 is enhanced when the total atomic density $A_{H+C}$ in the vicinity of the interface with the first semiconductor region 2 is higher than the total atomic density $A_{H+C}$ in the central portion in the thickness direction. That is, it is presumed that in this case, the effective lifetime in the first semiconductor region 2 is prolonged to further enhance the conversion efficiency of the solar cell element.

Figure 16:
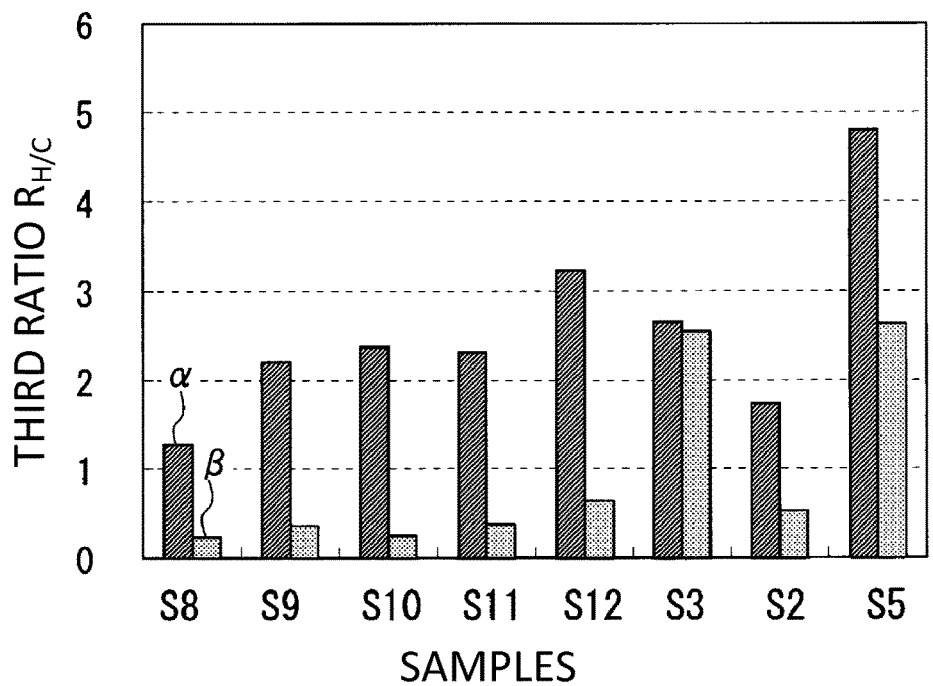
FIG. 16 is a graph showing the third ratios in samples S2, S3, and S8 to S12.

FIG. 16 is a bar graph showing a relationship between the third ratio $R_{H/C}$ in the first passivation layer 5 in the vicinity of the interface with the first semiconductor region 2 and the third ratio $R_{H/C}$ in the central portion in the thickness direction of the first passivation layer 5 with respect to samples S2, S3, S5, and S8 to S12. In FIG. 16, with respect to each of samples S2, S3, S5, and S8 to S12, each bar α in the left shows the third ratio $R_{H/C}$ in the first passivation layer 5 in the vicinity of the interface with the first semiconductor region 2 and each bar β in the right shows the third ratio $R_{H/C}$ in the central portion in the thickness direction of the first passivation layer 5.

As shown in FIG. 16, it was confirmed that in samples S3 and S5, the values obtained by dividing the third ratio $R_{H/C}$ in the first passivation layer 5 in the vicinity of the interface with the first semiconductor region 2 by the third ratio $R_{H/C}$ in the central portion in the thickness direction of the first passivation layer 5 were about 1 to 2. In contrast, it was confirmed that in samples S2 and S8 to S12, the values obtained by dividing the third ratio $R_{H/C}$ in the first passivation layer 5 in the vicinity of the interface with the first semiconductor region 2 by the third ratio $R_{H/C}$ in the central portion in the thickness direction of the first passivation layer 5 were about 3 to 10, higher than those in samples S3 and S5.

Figure 17:
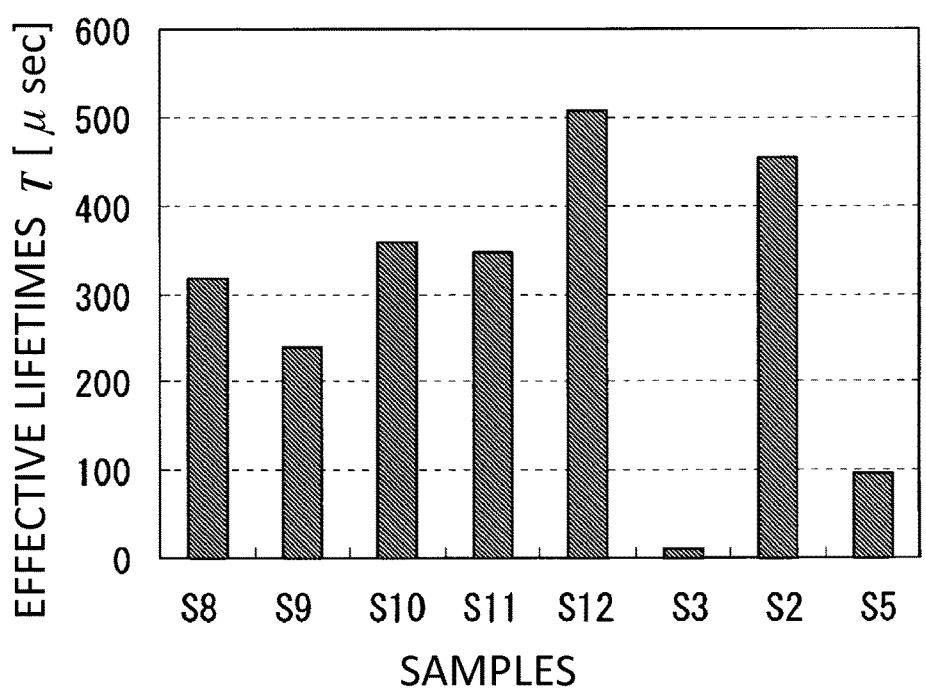
FIG. 17 is a graph showing the effective lifetimes in samples S2, S3, and S8 to S12.

FIG. 17 is a bar graph showing the effective lifetimes τ of samples S2, S3, S5, and S8 to S12. As shown in FIG. 17, the effective lifetimes τ of samples S2 and S8 to S12 were relatively long, 200 μsec or more, whereas the effective lifetimes τ of samples S3 and S5 were relatively short, less than 100 μsec.

Accordingly, it was demonstrated that a relatively long effective lifetime τ is obtained when the third ratio $R_{H/C}$ in the first passivation layer 5 in the vicinity of the interface with the first semiconductor region 2 is three times or more higher than the third ratio $R_{H/C}$ in the central portion in the thickness direction of the first passivation layer 5. It is presumed that in this case, the passivation effect by aluminum oxide of the first passivation layer 5 is improved to further enhance the conversion efficiency of the solar cell element.

In the examples described above, the first passivation layer 5 and the second passivation layer 6 were formed by an ALD method on all surfaces of the semiconductor substrate 1 under conditions that the substrate temperature was 175° C. or more. The substrate temperature may be, however, a temperature lower than 175° C., such as 135° C. In addition, the O3 gas may have a concentration of higher than 300 g/cm3 or may be supplied multiple times for increasing the compositional deficiency of Al.

REFERENCE SIGNS LIST 1 semiconductor substrate
1a, 10a first principal surface
1b, 10b second principal surface
2 first semiconductor region
3 second semiconductor region
4 third semiconductor region
5 first passivation layer
6 second passivation layer
7 antireflection layer
8 first electrode
9 second electrode
10 solar cell element
100 solar cell module

The invention claimed is:
1. A solar cell element comprising:
   a semiconductor substrate in which a p-type first semiconductor region and an n-type second semiconductor region are stacked such that the first semiconductor region is located nearest to a first principal surface side of the semiconductor substrate and the second semiconductor region is located nearest to a second principal surface side of the semiconductor substrate; and
   a first passivation film disposed on the first semiconductor region on the first principal surface side,
   wherein in an inside of the first passivation film, a first ratio obtained by dividing an aluminum atomic density by an oxygen atomic density is 0.613 or more and less than 0.667, and a second ratio obtained by dividing a sum of the aluminum atomic density and a hydrogen atomic density by the oxygen atomic density is 0.667 or more and less than 0.786, and
   wherein the first passivation film contains aluminum oxide, hydrogen, and carbon, wherein a third ratio in a central portion in a thickness direction of the first passivation film is less than 1, the third ratio being obtained by dividing the hydrogen atomic density by a carbon atomic density in the first passivation film, and wherein the third ratio in a vicinity of an interface with the first semiconductor region is higher than the third ratio in the central portion in the thickness direction of the first passivation film.

2. The solar cell element according to claim 1, wherein the first ratio of the first passivation film in a vicinity of an interface with the first semiconductor region is higher than the first ratio in the central portion in the thickness direction of the first passivation film.

3. The solar cell element according to claim 1, further comprising:
a second passivation film containing aluminum oxide and disposed on the second semiconductor region on the second principal surface side, wherein
the second passivation film contains carbon.

4. The solar cell element according to claim 1, wherein the hydrogen atomic density and the carbon atomic density are each $5 \times 10^{20}$ atoms/cm$^3$ or more.

5. The solar cell element according to claim 4, wherein the carbon atomic density is higher than the hydrogen atomic density in the central portion in the thickness direction of the first passivation film, and the carbon atomic density is less than $1 \times 10^{22}$ atoms/cm$^3$.

* * * * *